(12) United States Patent
Lo et al.

(10) Patent No.: US 12,495,603 B2
(45) Date of Patent: *Dec. 9, 2025

(54) SEMICONDUCTOR DEVICE AND MANUFACTURING METHOD FOR THE SAME

(71) Applicant: TAIWAN SEMICONDUCTOR MANUFACTURING COMPANY LTD., Hsinchu (TW)

(72) Inventors: Chih-Nan Lo, Hsinchu (TW); Ming-Chi Huang, Hsinchu County (TW); Hsin-Hsien Lu, Hsinchu (TW); Ming-Hsi Yeh, Hsinchu (TW); Kuo-Bin Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 61 days.

This patent is subject to a terminal disclaimer.

(21) Appl. No.: 18/172,344

(22) Filed: Feb. 22, 2023

(65) Prior Publication Data
US 2023/0215765 A1    Jul. 6, 2023

Related U.S. Application Data

(62) Division of application No. 17/142,173, filed on Jan. 5, 2021, now Pat. No. 11,594,455.

(51) Int. Cl.
*H10D 84/01* (2025.01)
*H01L 21/02* (2006.01)
(Continued)

(52) U.S. Cl.
CPC ... *H10D 84/0151* (2025.01); *H01L 21/02164* (2013.01); *H01L 21/02323* (2013.01);
(Continued)

(58) Field of Classification Search
CPC ..... H01L 21/823462; H01L 21/823857; H01L 21/823456; H01L 21/82385;
(Continued)

(56) References Cited

U.S. PATENT DOCUMENTS 5,976,979 A * 11/1999 Chen ................ H01L 21/31053
438/692
9,209,247 B2   12/2015  Colinge et al.
(Continued)

OTHER PUBLICATIONS

Definition of "over". Merriam-Webster Dictionary. (Year: 2025).*

*Primary Examiner* — Yu Chen
(74) *Attorney, Agent, or Firm* — WPAT LAW; Anthony King

(57) ABSTRACT

The present disclosure provides a method for fabricating a semiconductor structure, including forming a dielectric layer over a first region and a second region of a substrate, wherein the second region is adjacent to the first region, increasing a thickness of the dielectric layer in the first region, including forming an oxygen capturing layer over the dielectric layer in the first region, including forming the oxygen capturing layer over the first region and the second region, and removing the oxygen capturing layer over the second region with a mask layer, performing an oxidizing operation from a top surface of the oxygen capturing layer to increase oxygen concentration of the oxygen capturing layer, removing the oxygen capturing layer over the first region, and forming a gate structure over the dielectric layer.

20 Claims, 27 Drawing Sheets

(51) Int. Cl.
*H01L 21/3115* (2006.01)
*H01L 21/768* (2006.01)
*H01L 21/32* (2006.01)

(52) U.S. Cl.
CPC .... *H01L 21/02343* (2013.01); *H01L 21/3115* (2013.01); *H01L 21/76826* (2013.01); *H01L 21/76828* (2013.01); *H10D 84/0142* (2025.01); *H10D 84/0144* (2025.01); *H01L 21/32* (2013.01)

(58) Field of Classification Search
CPC ......... H01L 21/76822; H01L 21/76826; H01L 21/76828; H01L 21/3115; H01L 21/32; H01L 21/02164; H01L 21/02255; H01L 21/02321; H01L 21/02323; H01L 21/02337; H01L 21/0234; H01L 21/02343; H01L 21/3165–31679; H01L 21/0223–02241; H10D 84/0149; H10D 84/0186; H10D 84/0144; H10D 84/0181; H10D 84/8314; H10D 84/0151; H10D 84/0188; H10D 64/017; H10D 64/025–027; H10D 64/512; H10D 64/513
See application file for complete search history.

(56) References Cited

U.S. PATENT DOCUMENTS

| | | | |
|---|---|---|---|
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2004/0092133 | A1* | 5/2004 | Hyun .............. H01L 21/823462 438/758 |
| 2011/0003467 | A1* | 1/2011 | Kanda .................. H10D 84/038 438/585 |
| 2014/0065808 | A1* | 3/2014 | Grass .................. H01L 21/0234 257/E21.409 |
| 2017/0018453 | A1* | 1/2017 | Park .................... H10B 12/0335 |
| 2020/0006152 | A1* | 1/2020 | Su ...................... H01L 21/31144 |

\* cited by examiner

SEMICONDUCTOR DEVICE AND MANUFACTURING METHOD FOR THE SAME

CROSS REFERENCE TO RELATED APPLICATIONS

This application is a divisional application of prior-filed U.S. Application No. U.S. Ser. No. 17/142,173, filed Jan. 5, 2021.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
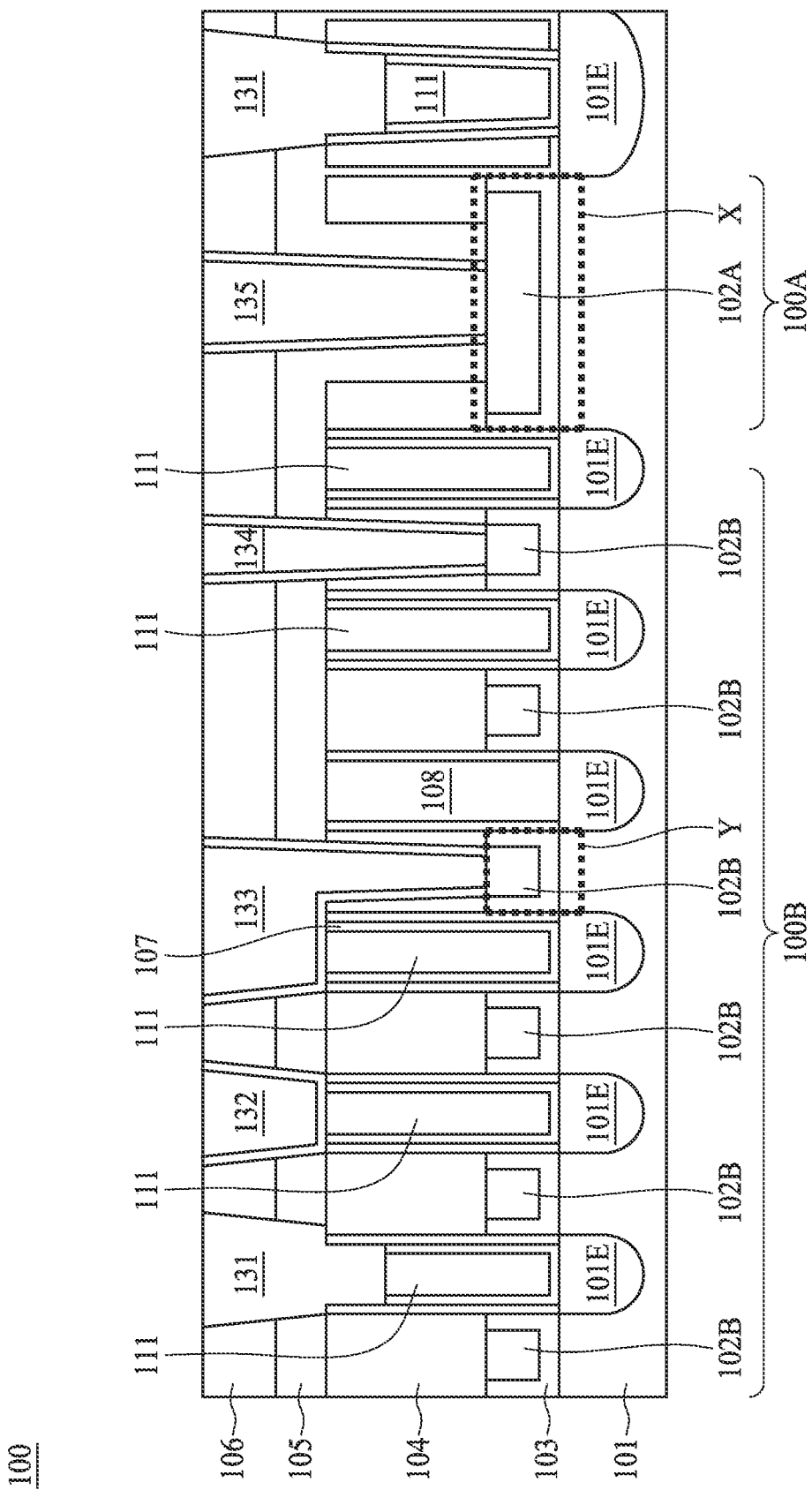
FIG. 1A is a schematic drawing illustrating a cross sectional view of a semiconductor device, in accordance with a comparative embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In advanced technology generations, device size is scaled down in order to achieve better performance. However, the scale-down approach often requires more accurate control over dimensions and/or thickness of features and layers. For example, physical thickness of the dielectric layers become thinner and the formation method or condition thereof may be changed in order to comply with design rules under advanced generations, however, such approaches often faces reliability issues. These issues often occurs in I/O region of various devices, such as FinFET, Complementary Metal-Oxide-Semiconductor (CMOS), Metal-Oxide-Semiconductor Field Effect Transistor (MOSFET), nanowire structure, nanosheet structure, gate-all-around (GAA) structure, or the like.

The present disclosure provides methods as discussed in FIG. 2A to FIG. 3H, FIG. 4A to FIG. 4B, and FIG. 5A to FIG. 6I, which can be applied to the semiconductor structures discussed in FIG. 1A to FIG. 1D or other types of devices such as FinFET, nanowire structure, nanosheet structure, Metal-Oxide-Semiconductor Field-Effect Transistor (MOSFET), gate-all-around (GAA) structure, fin structures, or the like. It is noted that the method discussed in FIG. 2A to FIG. 3H, FIG. 4A to FIG. 4B, and FIG. 5A to FIG. 6I can also be combined or incorporated to comply with certain design rules or requirements.

Referring to FIG. 1A, FIG. 1A is a schematic drawing illustrating a cross sectional view of a semiconductor device, in accordance with a comparative embodiment. A semiconductor device 100 includes a substrate 101, an interlayer dielectric (ILD) 103, and a plurality of gate structures 102A and 102B. In some embodiments, the substrate 101 includes silicon, alternatively or additionally, the substrate 101 includes another material, such as germanium, silicon carbide, gallium arsenide, gallium phosphide, indium phosphide, indium arsenide, and/or indium antimonide, or, an alloy semiconductor, such as silicon germanium (SiGe), GaAsP, AlInAs, AlGaAs, GaInAs, GaInP, and/or GaInAsP; or combinations thereof. In some other embodiments, substrate 101 includes one or more group III-V materials, one or more group II-IV materials, or combinations thereof. In some other embodiments, the substrate 101 is a semiconductor-on-insulator substrate, such as a silicon-on-insulator (SOI) substrate, a silicon germanium-on-insulator (SGOI) substrate, or a germanium-on-insulator (GOI) substrate. In some other embodiments, substrate 101 may include active regions. In some embodiments, the substrate 101 includes various conductive regions 101E configured according to design specifications, such as source regions or drain regions, which include epitaxial material doped with dopants (such as p-type or n-type dopant), in some embodiments. The substrate 101 includes a first region 100A and a second region 100B adjacent to the first region 100A. In some embodiments, the first region 100A is an I/O region and the second region 100B is a core region. The ILD 103 is deposited over the first region 100A and the second region 100B.

A material of the ILD 103 is oxide-based layer, such as silicon oxide (SiO$_x$), or the like. Gate structure(s) 102A is formed in the ILD 103 over the first region 100A and gate structure(s) 102B is formed in the ILD 103 over the second region 100B. A first insulation layer 104 is above the ILD 103 and the gate structures 102A and 102B. Examples of gate structures will be discussed in FIG. 1B, FIG. 1C and FIG. 1D.

The semiconductor device 100 may further include interconnect structures traversing the first insulation layer 104 and above the conductive regions 101E or the gate structures 102A and 102B. For example, a plurality of conductive vias 111 (which may include cobalt or other types of high conductivity material) are disposed above some of the conductive regions 101E. A barrier layer 107 may be lining the sidewall of each of the conductive vias 111. In some embodiments, an isolating dielectric layer 108 traversing the first insulation layer 104 and the ILD 103 may be disposed over a conductive region 101E. An etch stop layer 105 can be formed over the first insulation layer 104, and a second insulation layer 106 can be formed over the etch stop layer 105. The interconnect structure further includes a plurality of conductive vias traversing the etch stop layer 105 and the second insulation layer 106, and connected to the gate structures 102A and 102B or the conductive regions 101E. For example, a contact 131 electrically connected to conductive vias 111 and has a portion below a top surface of the first insulation layer 104; a contact 132 electrically connected to conductive vias 111; a contact 133 electrically connected to a conductive via 111 and a gate structure 102B, a contact 134 electrically connected to a top surface of a gate structure 102B in the second region 100B; and/or a contact 135 electrically connected to a top surface of a gate structure 102A in the first region 100A. It should be noted that the interconnect structure in the present disclosure is not limited thereto. The configuration of the interconnect structure may be adjusted based on design rule or specific requirement.

Figure 1B:
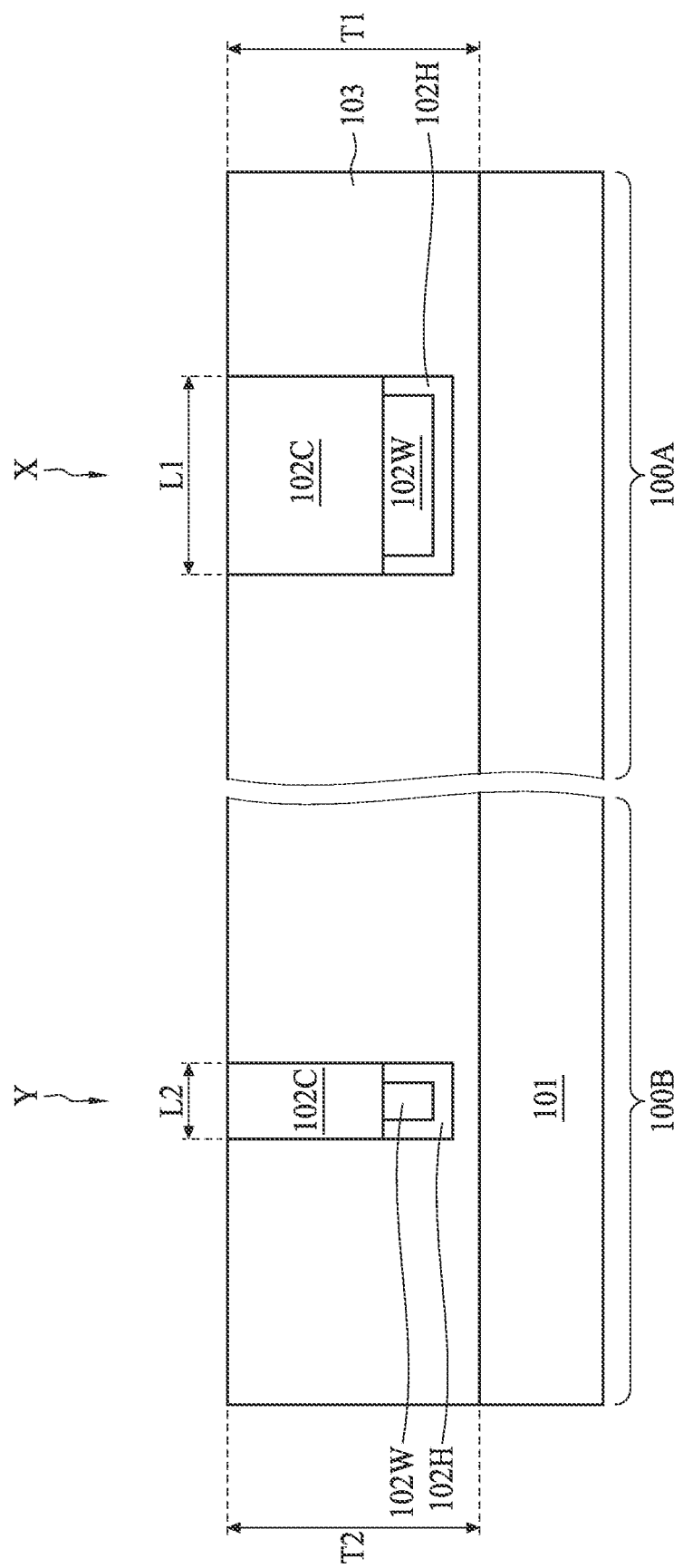
FIG. 1B is a partially enlarged fragmentary diagrammatic views of portions X and Y of the semiconductor device of FIG. 1A, according to some embodiments of the present disclosure.

Referring to FIG. 1B, FIG. 1B is a partially enlarged fragmentary diagrammatic views of portions X and Y of the semiconductor device of FIG. 1A, according to some embodiments of the present disclosure. In an example of the semiconductor device 100 including FinFET structures, the gate structures 102A and 102B may include a high-k layer 102H lining with an inner sidewall of the ILD 103, and a work function metal layer 102W lining with an inner sidewall of the high-k layer 102H. In some of the embodiments, the work function metal layer 102W may include one metal layer or multiple laminated metal layers. In some of the embodiments, a conductive feature can be disposed over the high-k layer 102H, and further connected to overlying conductive interconnect structures. In some embodiments, a gate dimension L1 of the gate structure 102A over the first region 100A is greater than a gate dimension L2 of the gate structure 102B over the second region 100B. Alternatively, the gate dimension L1 of the gate structure 102A over the I/O region is greater than a gate dimension L2 of the gate structure 102B over the core region. In some embodiments, a portion of the ILD 103 (and/or gate dielectric layer) is between a bottom of the high-k layer 102H and the substrate 101.

Figure 1C:
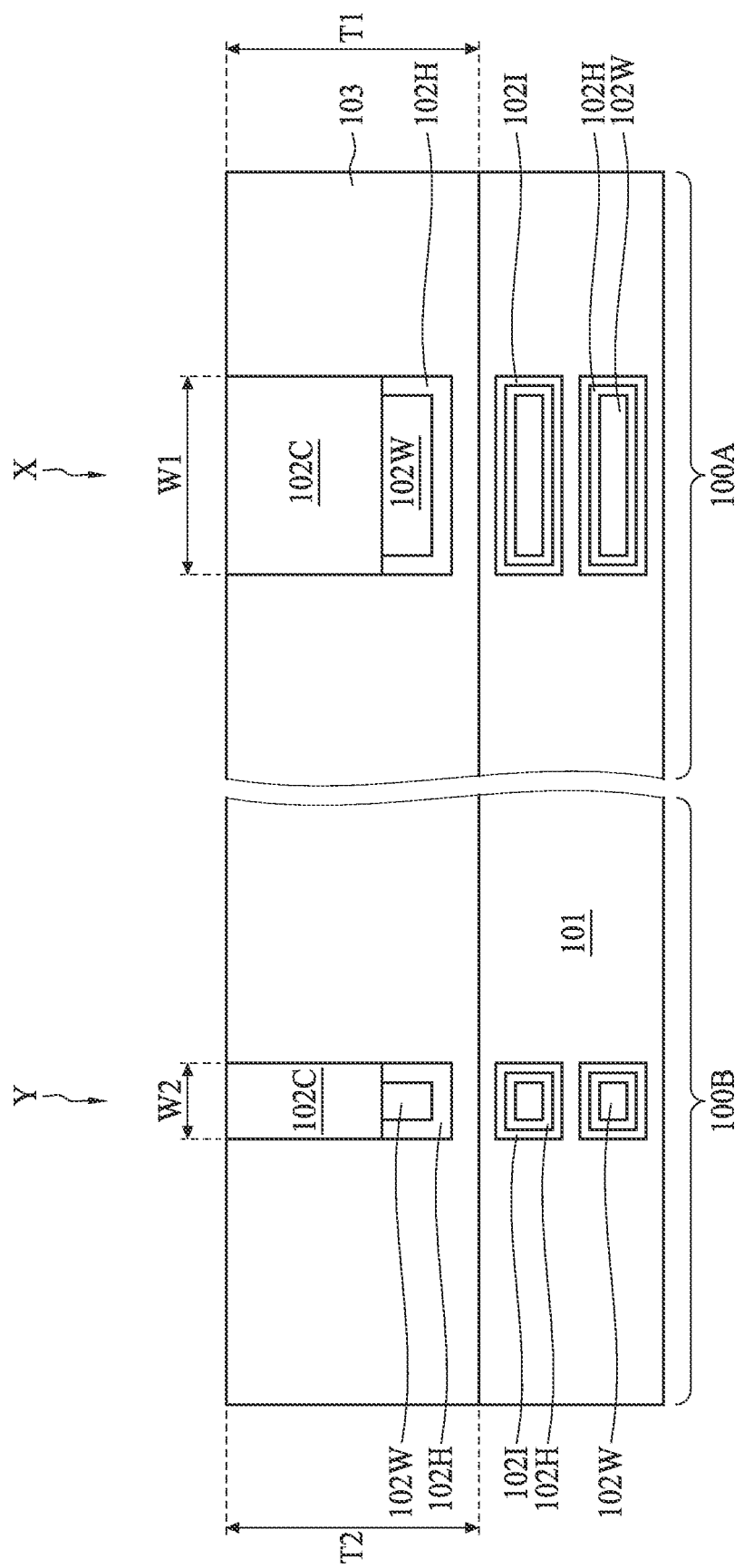
FIG. 1C is a partially enlarged fragmentary diagrammatic views of portions X and Y of the semiconductor device of FIG. 1A, according to some embodiments of the present disclosure.

Referring to FIG. 1C, FIG. 1C is a partially enlarged fragmentary diagrammatic views of portions X and Y of the semiconductor device of FIG. 1A, according to some embodiments of the present disclosure. In another example of the semiconductor device 100 including gate-all-around structures, the semiconductor device 100 includes gate structure(s) 102A over the first region 100A and gate structure(s) 102B over the second region 100B. The gate structures 102A and 102B include work function metal layer 102W, high-k layer 102H surrounding the work function metal layer 102W, and the interfacial dielectric 102I surrounding the high-k layer 102H. In some embodiments, a portion of high-k layer 102H is above the substrate 101 and lining with an inner sidewall of the ILD 103, and a work function metal layer 102W is lining with an inner sidewall of the portion of the high-k layer 102H above the substrate 101. In some of the embodiments, the work function metal layer 102W may include one metal layer or multiple laminated metal layers. In some embodiments, a portion of the ILD 103 (and/or gate dielectric layer) is between a bottom of the high-k layer 102H and the substrate 101. In some of the embodiments, a conductive capping 102C can be disposed over the high-k layer 102H, and further connected to overlying conductive interconnect structures. In some embodiments, a gate width W1 of the gate structure 102A over the first region 100A is greater than a gate width W2 of the gate structure 102B over the second region 100B.

Figure 1D:
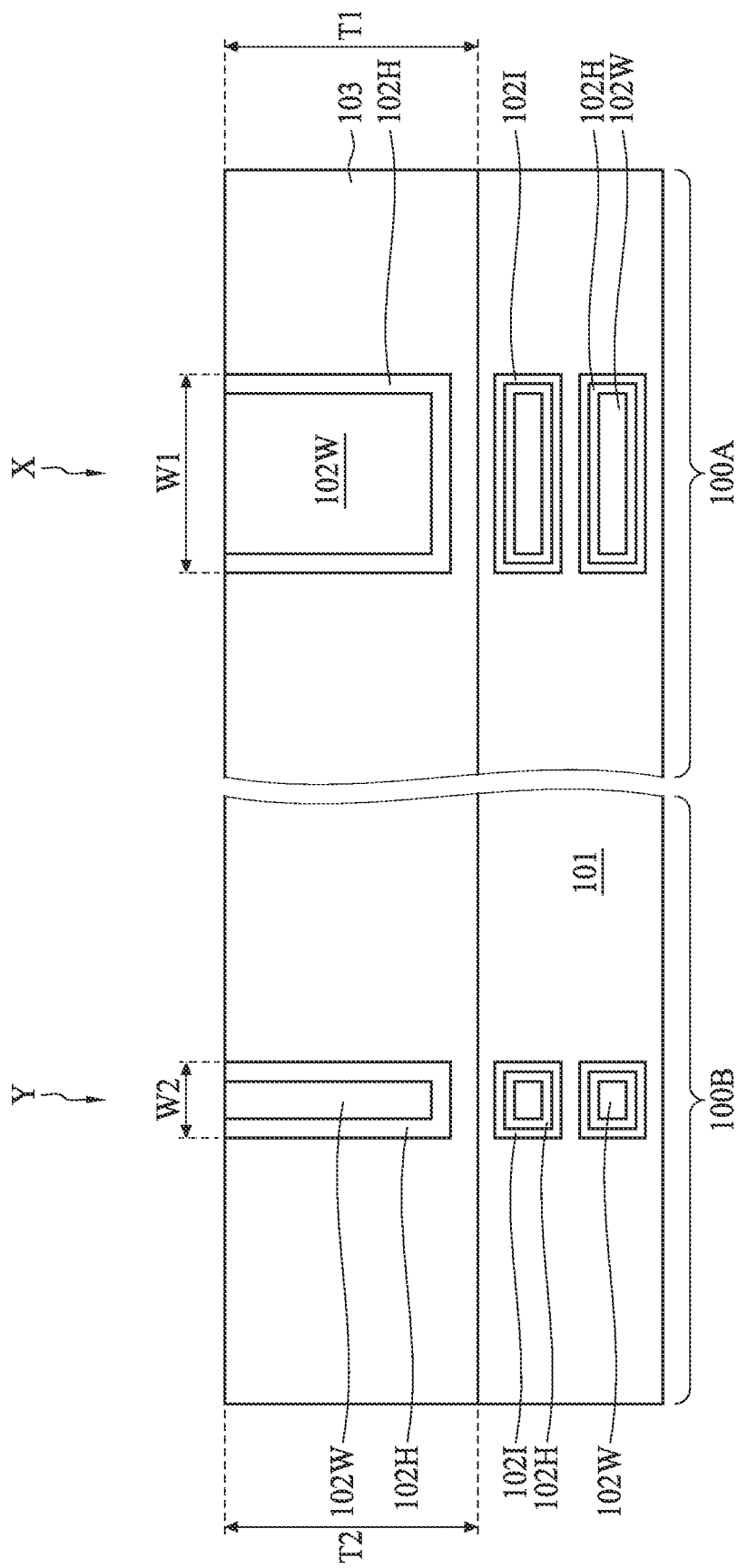
FIG. 1D is a partially enlarged fragmentary diagrammatic views of portions X and Y of the semiconductor device of FIG. 1A, according to some embodiments of the present disclosure.

Referring to FIG. 1D, FIG. 1D is a partially enlarged fragmentary diagrammatic views of portions X and Y of the semiconductor device of FIG. 1A, according to some embodiments of the present disclosure. In some embodiments, the gate structures 102A and 102B shown in FIG. 1D is similar to the gate structures 102A and 102B as shown in FIG. 1C, but the difference resides in that the embodiments in FIG. 1D does not include capping 102C, and a top surface of the work function metal layer 102W can be coplanar with a top surface of the ILD 103.

By applying the techniques discussed in FIG. 2A to FIG. 3H, FIG. 4A to FIG. 4B, and FIG. 5A to FIG. 6I, the reliability of the structures discussed in FIG. 1A to FIG. 1D or other semiconductor structures may be improved. Specifically, the capacitance equivalent thickness (CET) of the ILD 103 in the first region 100A can be improved comparing to the comparative embodiments of not applying such techniques. In some embodiments, the CET of the ILD 103 in the first region 100A is greater than the CET of the ILD 103 in the second region 100B. For example, in order to achieve adequate reliability, the CET of the ILD 103 in the first region 100A is greater than 16.0 Angstrom, and the CET of the ILD 103 in the second region 100B is in a range from about 12.5 Angstrom to about 13.5 Angstrom. In some of the embodiments, the physical thickness of the ILD 103 in the first region 100A is greater than the physical thickness of the ILD 103 in the second region 100B, but the present disclosure is not limited thereto. In some other cases, the physical thickness of the ILD 103 in the first region 100A may be similar to the physical thickness of the ILD 103 in the second region 100B due to requirement.

Improved CET of the ILD 103 in the first region 100A may reflect in various perspectives. For example, time to breakdown, tolerance of maximum voltage, ability to reduce leakage current, or the like. The aforementioned features may be measurable by certain tools. In some embodiments, since I/O region (e.g. first region 100A as shown in FIG. 1A to FIG. 1D) often requires higher CET of dielectric layers (e.g. ILD 103), the following techniques may be able to especially improve the capacitance equivalent thickness of dielectric in first region 100A and alleviate impact on core region (e.g. second region 100B) during the operation.

Figure 2A:
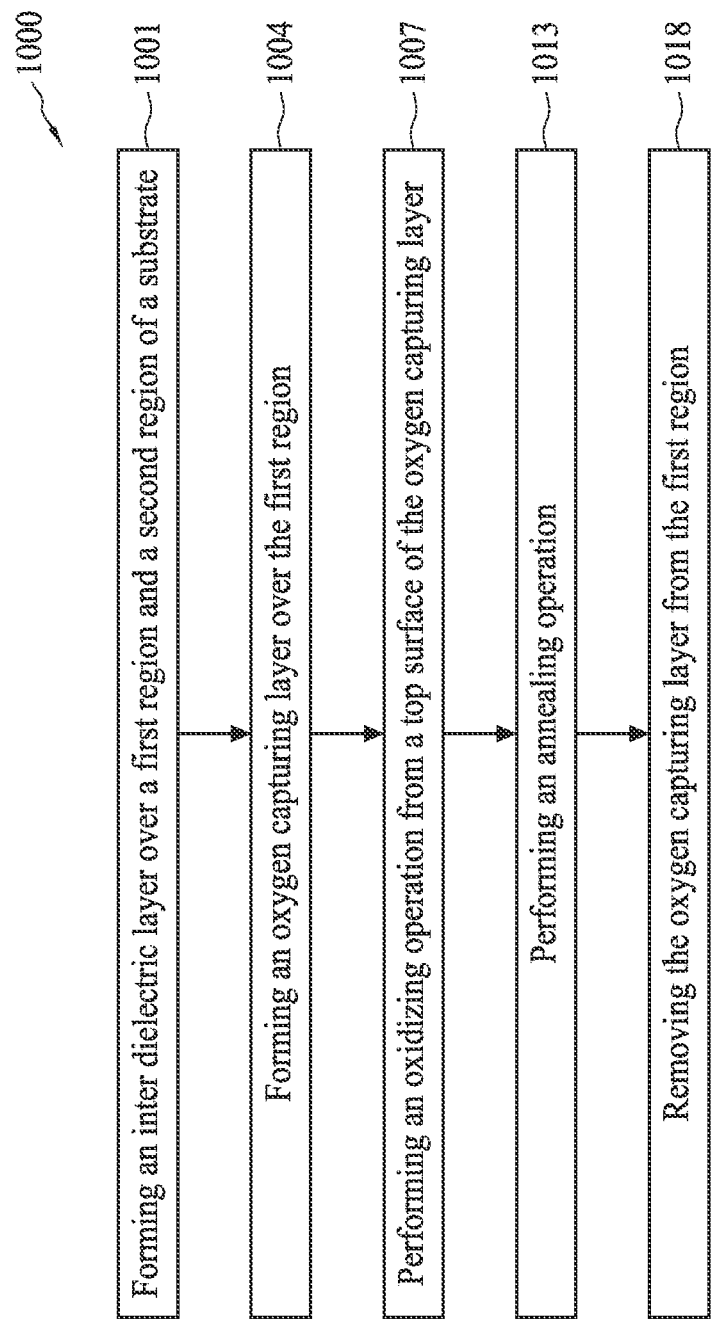
FIG. 2A shows a flow chart representing a method for fabricating a semiconductor device, in accordance with some embodiments of the present disclosure.

Referring to FIG. 2A, FIG. 2A shows a flow chart representing a method for fabricating a semiconductor device, in accordance with some embodiments of the present disclosure. The method 1000 for fabricating a semiconductor device includes forming an inter dielectric layer over a first region and a second region of a substrate (operation 1001, which can be referred to FIG. 3A or operation O101 in FIG. 2B), forming an oxygen capturing layer over the first region (operation 1004, which can be referred to FIG. 3B or operation O101 in FIG. 2B), performing an oxidizing operation from a top surface of the oxygen capturing layer (operation 1007, which can be referred to FIG. 3F or operation O105 in FIG. 2B), performing an annealing operation (operation 1013, which can be referred to FIG. 3F or operation O106 in FIG. 2B), and removing the oxygen capturing layer from the first region (operation 1018, which can be referred to FIG. 3G or operation O107 in FIG. 2B).

Figure 2B:
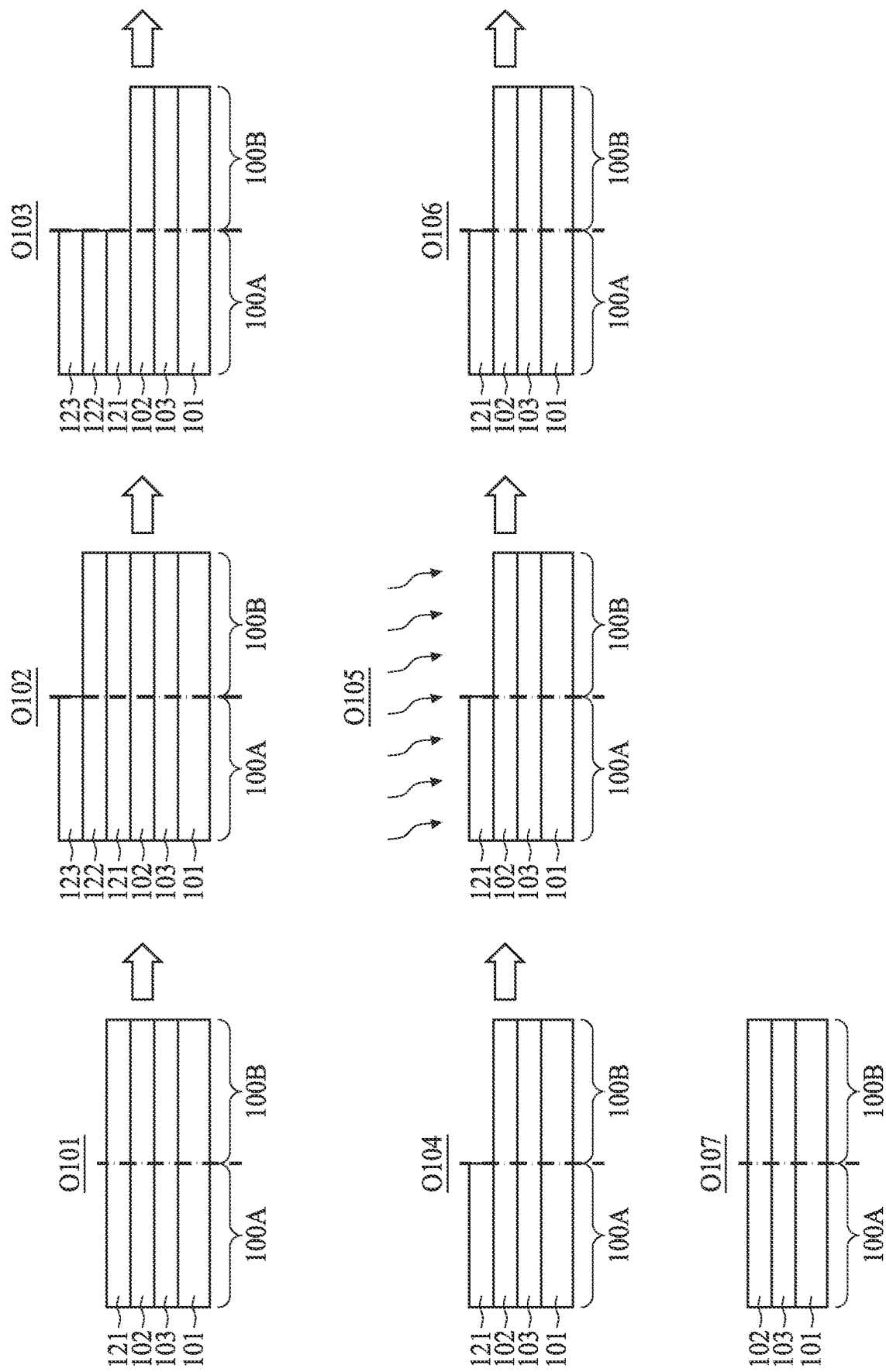
FIG. 2B shows a schematic flow chart representing a method for fabricating a semiconductor device, in accordance with some embodiments of the present disclosure.

FIG. 2B shows a schematic flow chart representing a method for fabricating a semiconductor device, in accordance with some embodiments of the present disclosure. Each operation shown in FIG. 2B will be subsequently discussed in FIG. 3A to FIG. 3H. It should be noted that the flow in FIG. 2B can also be applied to other types of semiconductor structures.

Figure 3A:
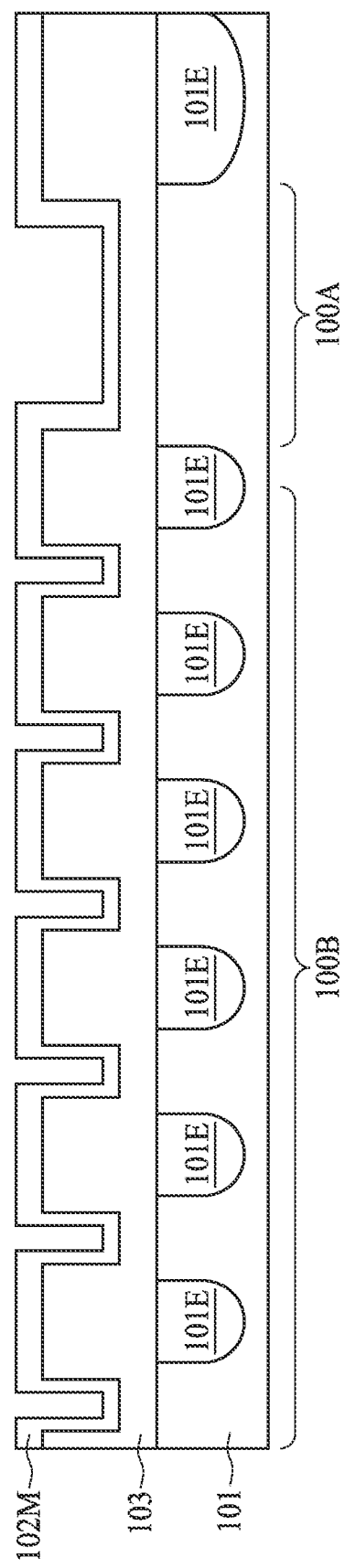
FIG. 3A to FIG. 3H are cross sectional views of a semiconductor device during intermediate stages of manufacturing operations, according to some embodiments of the present disclosure.

Referring to FIG. 2B and FIG. 3A, FIG. 3A is a cross sectional view of a semiconductor device during intermediate stages of manufacturing operations, according to some embodiments of the present disclosure. In operation O101, a substrate 101 is provided. In some embodiments, the substrate 101 includes silicon, alternatively or additionally, the substrate 101 includes another material, such as germanium, silicon carbide, gallium arsenide, gallium phosphide, indium phosphide, indium arsenide, and/or indium antimonide, or, an alloy semiconductor, such as silicon germanium (SiGe), GaAsP, AlInAs, AlGaAs, GaInAs, GaInP, and/or GaInAsP; or combinations thereof. In some other embodiments, substrate 101 includes one or more group III-V materials, one or more group II-IV materials, or combinations thereof. In some other embodiments, the substrate 101 is a semiconductor-on-insulator substrate, such as a silicon-on-insulator (SOI) substrate, a silicon germanium-on-insulator (SGOI) substrate, or a germanium-on-insulator (GOI) substrate. In some other embodiments, substrate 101 may include active regions. A plurality of conductive regions 101E, such as source regions or drain regions, which include epitaxial material doped with dopants (such as p-type or n-type dopant) are formed over a top surface of the substrate 101. The substrate includes a first region 100A and a second region 100B adjacent to the first region 100A.

An ILD 103 is deposited over the first region 100A and the second region 100B. A material of the ILD 103 is oxide-based layer, such as silicon oxide ($SiO_x$), or the like. In some embodiments, due to the requirement in advanced technology node, suitable formation method should be selected to comply with certain requirement. Specifically, some of the conventional deposition methods faces challenges of (or not compatible to) forming ILD layer in I/O region in advanced technology nodes of, including but not limited to, FinFET, Metal-Oxide-Semiconductor Field-Effect Transistor (MOSFET), nanowire structure, nanosheet structure, gate-all-around (GAA) structure, Complementary Metal-Oxide-Semiconductor(CMOS), or the like. It is especially challenging to form ILD layer in I/O region in 3 nm technology node or even more advanced nodes due to the scale-down trend of feature size/space. Therefore, in some of the embodiments, ILD 103 is formed by chemical approach, including applying SPM (including $H_2SO_4$, $H_2O_2$), SC1 (including $NH_4OH$, $H_2O_2$, $H_2O$), SC2 (including HCl, $H_2O_2$, $H_2O$), $O_3$ water, or other suitable chemical over the substrate 101, which is suitable for forming semiconductor structures with smaller critical dimension.

However, such chemical approach often faces the challenge of reliability issues in terms of being lack of capacitance equivalent thickness (CET). ILD with lower CET would suffer from the problem of dielectric breakdown in terms of having lower time to breakdown or lower tolerable voltage threshold. These types of issues often further cause leakage voltage issues and decrease device performance. In order to address the issue, CET of the ILD 103 is enhanced by the techniques discussed subsequently.

A plurality of recessed are formed (for example, by etching) at a top surface of the ILD 103, and a high-k material 102M is deposited over the top surface of the ILD 103 over the first region 100A and the second region 100B. In some embodiments, the high-k material 102M conforms to the profile of the top surface of the ILD 103. In some embodiments, prior to forming the high-k material 102M, a cleaning operation may be performed.

Figure 3B:
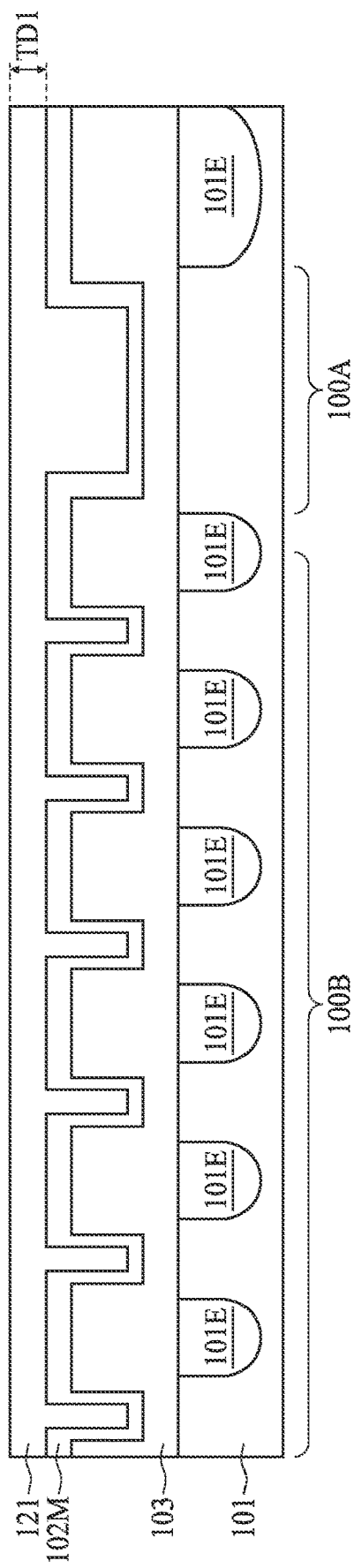

Referring to FIG. 3B, FIG. 3B is a cross sectional view of a semiconductor device during intermediate stages of manufacturing operations, according to some embodiments of the present disclosure. Referring to operation O102 (shown in FIG. 2B), an oxygen capturing layer 121 is formed above the high-k material 102M over the first region 100A and the second region 100B. A material of the oxygen capturing layer 121 may be transition metal-based material, such as TiN, TiSiN, TiAlN, TaN, TaSiN, TaAlN, MoN, MoAlN, WN, WSiN, WCN, or the like. It should be noted that other suitable materials that can absorb oxygen can also be candidates of oxygen capturing layer 121, such as some of the metal-based materials, nitride-based material, or other suitable materials. A thickness TD1 of the oxygen capturing layer 121 is in a range from about 5 Angstrom to about 30 Angstrom.

Figure 3C:
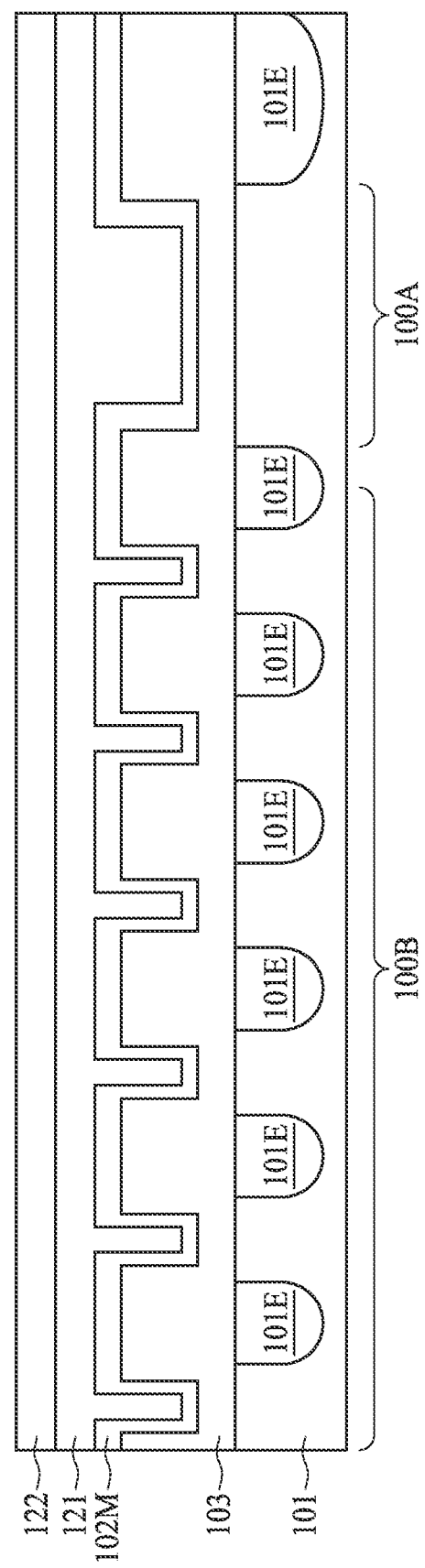

Referring to FIG. 3C, FIG. 3C is a cross sectional view of a semiconductor device during intermediate stages of manufacturing operations, according to some embodiments of the present disclosure. Referring to operation O102 (shown in FIG. 2B), a mask layer 122 is formed above the oxygen capturing layer 121 over the first region 100A and the second region 100B. A material of the mask layer 122 can be AlO, AlON, TiAl, TiAlO, TaAl, TaAlO, ZrO, LaO, or other suitable material. In some embodiments, the materials of the mask layer 122 are suitable to be utilized as a mask under a photolithography operation. Furthermore, as will be discussed in FIG. 3E, under certain removal operation (such as etching operation), an etch rate on the mask material is greater than an etch rate on the oxygen capturing layer 121, thus most of the oxygen capturing layer 121 may be remained while removing the mask layer 122.

Figure 3D:
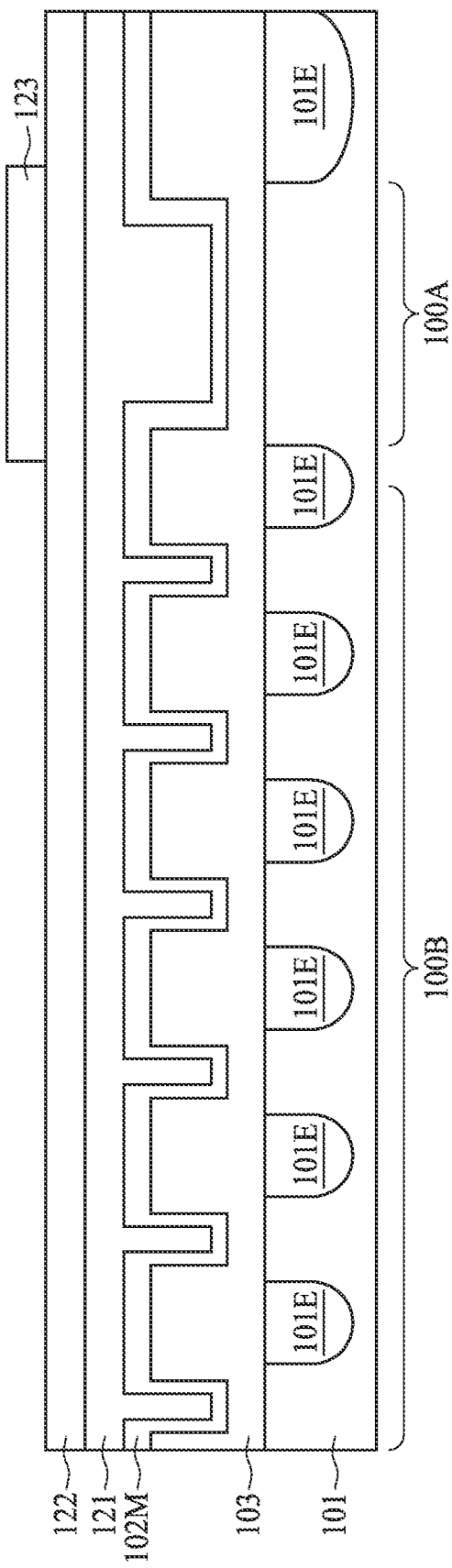

Referring to FIG. 3D, FIG. 3D is a cross sectional view of a semiconductor device during intermediate stages of manufacturing operations, according to some embodiments of the present disclosure. Referring to operation O102 (shown in FIG. 2B), a bottom anti-reflective-coating (BARC) 123 is formed to cover a top surface of the mask layer 122 in the first region 100A. The formation of the BARC 123 includes forming a photoresist layer to define regions to be removal, and by using photolithography patterning and etching techniques, the BARC over the second region 100B is removed.

Figure 3E:
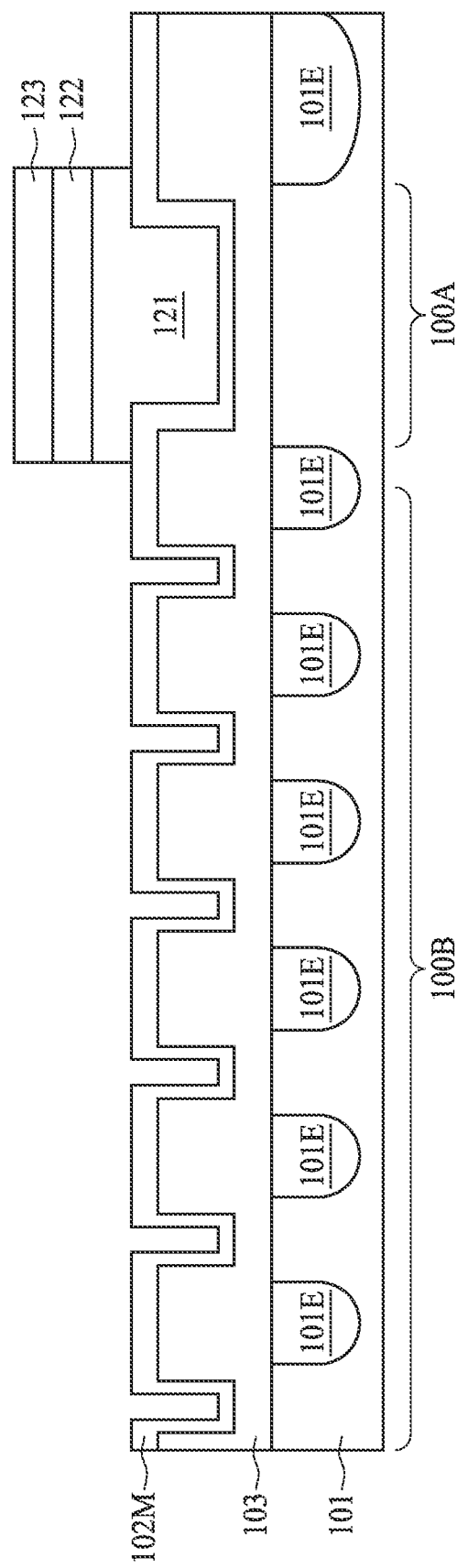

Referring to FIG. 3E, FIG. 3E is a cross sectional view of a semiconductor device during intermediate stages of manufacturing operations, according to some embodiments of the present disclosure. Referring to operation O103 (shown in FIG. 2B), the oxygen capturing layer 121 and the mask layer 122 in the second region 100B not covered by the BARC 123 are removed. In some embodiments, the removal operation includes ashing operation, or other suitable methods. The oxygen capturing layer 121 and the mask layer 122 in the first region 100A are remained. In some embodiments, the high-k material 102M in the second region 100B may be exposed after the removal operation.

Figure 3F:
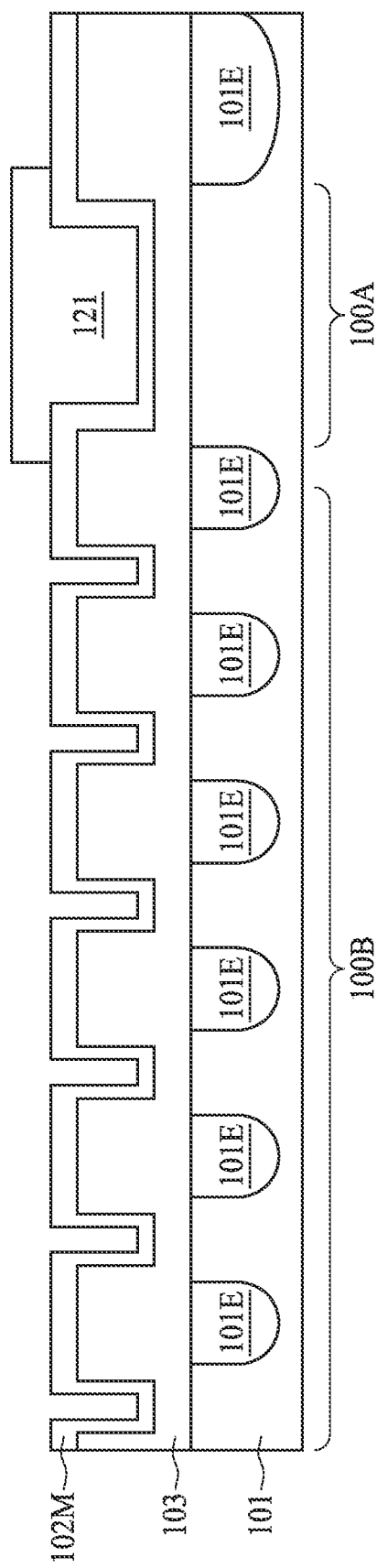

Referring to FIG. 3F, FIG. 3F is a cross sectional view of a semiconductor device during intermediate stages of manufacturing operations, according to some embodiments of the present disclosure. Referring to operation O104 (shown in FIG. 2B), the mask layer 122 in the first region 100A and the BARC 123 are removed. Referring to operation O105 (shown in FIG. 2B), an oxidation operation is performed to increase a concentration of oxygen of the oxygen capturing layer 121 in the first region 100A. For example, an oxidizing agent is applied over the exposed top surface of the oxygen capturing layer 121 in the first region 100A, and the oxygen capturing layer 121 captures oxide from the oxidizing agent. By using the oxidizing agent, the effect of increasing the oxide concentration of the oxygen capturing layer 121 is greater than only absorbing oxygen from air. Furthermore, some of the oxidizing agent may cause less damage over the second region 100B or other structures over other area of the substrate 101, comparing to some aggressive and intense approaches. In some embodiments, the oxidizing agent can be liquid agent such as ozonated deionized water ($DIO_3$), other oxygen-containing solution, ozone-containing solution, or other suitable agent. The concentration of $DIO_3$ is in a range from about 6 ppm to about 50 ppm. If the concentration is less than 6 ppm in the solution, the efficiency of oxidation may be lower. The application of the $DIO_3$ can be operated under a temperature from about 20° C. to about 80° C. The duration of applying the $DIO_3$ is in a range from about 30 seconds to about 300 second. In some cases, sulking the oxygen capturing layer 121 in the $DIO_3$ longer than 300 second might not effectively further increase the oxygen concentration thereof. In some cases, sulking the oxygen capturing layer 121 in the $DIO_3$ less than 30 second might not adequately increase the oxygen concentration thereof.

After applying the oxidizing agent, such as $DIO_3$, a rinsing medium may be applied over the substrate 101 to remove the remaining oxidizing agent. For example, the rinsing medium may be pure deionized water, deionized water with $CO_2$, deionized water, or the like. After performing the rinsing operation, a drying operation, such as $N_2$ drying, isopropyl alcohol (IPA) drying, can be performed. In some embodiments, the aforementioned oxidation operation, rinsing and drying may be performed within a single wet tool to facilitate the process.

In some alternative embodiments, the oxidation operation can also be conducted by utilizing scanning probe microscope (SPM) oxidation or $O_2$ plasma ash, such as under the condition of damage to the second region 100B can be alleviated, prevented or recovered by further approach.

The increase amount of oxygen in the oxygen capturing layer 121 in the first region 100A can be measured by various methods, such as measuring the magnitude of signal of oxygen in X-ray photoelectron spectroscopy (XPS). For example, [O](atomic % of oxygen) is increased from a range about 33.0% to 35.0% to a range about 40.0% to 49.0%, or in some cases, increased by about 5% to about 16.0% (but the present disclosure is not limited thereto). Another indicator is a ratio the concentration of oxide over a concentration of another element. For example, in the cases of using titanium nitride (TiN) as the oxygen capturing layer 121, the #[O]/#[Ti](ratio of magnitudes of signal of two subjected element under XPS) is increased from a range of 0.46-0.48 to 0.58-0.78 (but the present disclosure is not limited thereto), which indicates that the atomic concentration of oxygen is indeed increased.

Referring to operation O106 (shown in FIG. 2B), a thermal annealing operation is performed to conduct thermal drive-in operation. Specifically, a portion of oxygen is released from oxygen capturing layer 121 under elevated temperature (for example, in a range from about 600° C. to about 900° C.) and drove into the underlying ILD 103 over the first region 100A. A duration of the thermal annealing operation may be in a range from about 60 seconds to about 300 seconds. In some embodiments, nitrogen may be supplied into the thermal chamber during the thermal operation. In some embodiments, when the thermal operation is performed under less than 600° C., the efficiency of drive-in may be less than desired. In some embodiments, when the thermal annealing operation is performed over 900° C., some of the device in other areas may be affected.

The capacitance equivalent thickness (CET) of the ILD 103 in the first region 100A can thereby be increased. In some embodiments, the CET of the ILD 103 in the first region 100A is greater than the CET of the ILD 103 in the second region 100B. In some cases, the physical thickness of the ILD 103 in the first region 100A is also increased after performing the oxidation and thermal drive-in operation. For example, a thickness of the ILD 103 in the second region 100B and an original thickness of the ILD 103 in the first region 100A is in a range from about 10.5 Angstrom to about 11.5 Angstrom, and after the oxidation and thermal drive-in operation, the ILD 103 in the first region 100A becomes thicker than the ILD 103 in the second region 100B. In some embodiments, the thickness of the ILD 103 in the first region 100A is increased by a range from about 0.5 Angstrom to about 2.0 Angstrom, or alternatively, increased to be in a range from about 12.5 Angstrom to about 15.0 Angstrom.

In the embodiments of ILD 103 includes silicon oxide ($SiO_x$) and the substrate 101 includes silicon or silicon-based material, a portion of the top surface of the substrate 101 in the first region 100A may also be oxidized and forms silicon oxide ($SiO_x$). In some of such cases, a portion of boundary between the ILD 103 and the substrate 101 in the first region 100A may be below a top surface of the substrate 101 in the second region 100B.

Figure 3G:
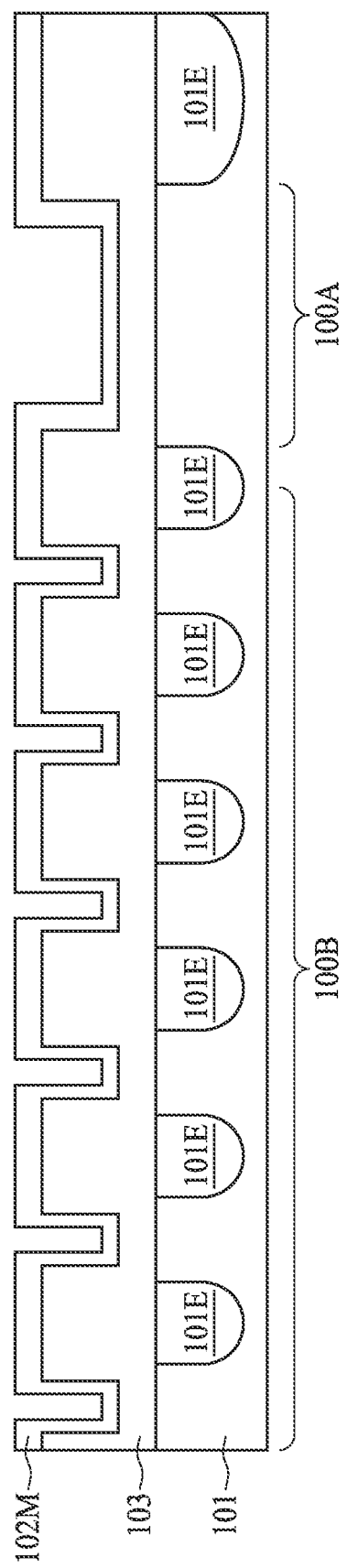

Referring to FIG. 3G, FIG. 3G is a cross sectional view of a semiconductor device during intermediate stages of manufacturing operations, according to some embodiments of the present disclosure. Referring to operation O107 (shown in FIG. 2B), the oxygen capturing layer 121 in the first region 100A is removed. In some embodiments, the removal operation includes stripping.

Figure 3H:
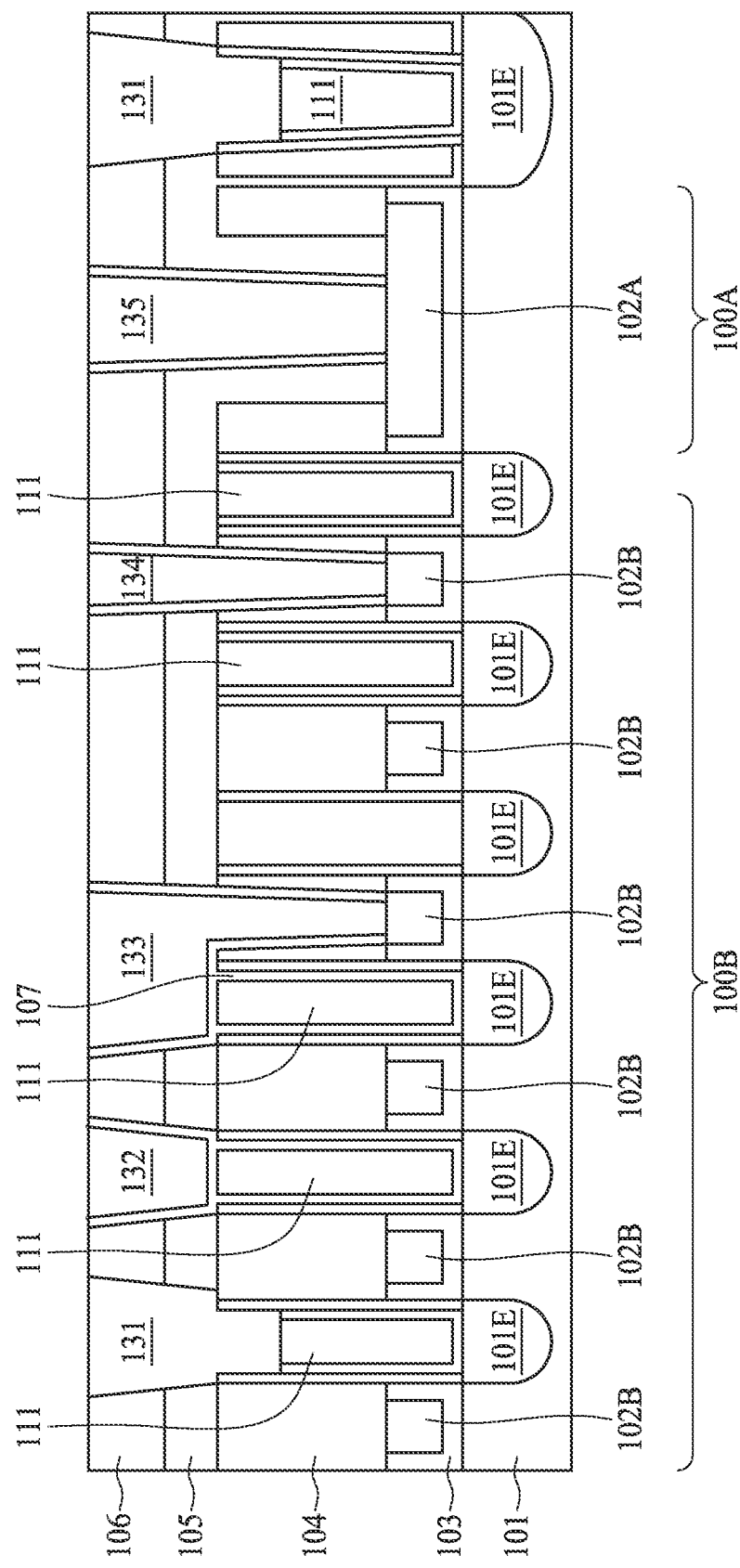

Referring to FIG. 3H, FIG. 3H is a cross sectional view of a semiconductor device during intermediate stages of manufacturing operations, according to some embodiments of the present disclosure. The gate structures 102A and 102B (such as the ones shown in FIG. 1B, FIG. 1C or FIG. 1D) are formed by removing a portion of the high-k material 102M and/or filling in work function metal 102W. In some embodiments (as shown in FIG. 1B and FIG. 1C), a conductive capping 102C can be formed over the work function metal 102W. In some embodiments, the formation of gate structures 102A and 102B includes performing a planarization operation (such as chemical mechanical planarization) to remove excessive high-k material 102M, work function metal 102W and/or capping 102C. The interconnect structures as discussed in FIG. 1A can be formed over the gate structures 102A and 102B (but it should be noted that the present disclosure is not limited to the configuration shown in FIG. 1A).

For example, after forming the gate structures 102A in the first region 100A and the gate structures 102B in the second region 100B, a first insulation layer 104 is formed over the gate structures 102A, gate structures 102B and ILD 103. An etch stop layer 105 is formed over the first insulation layer 104, and a second insulation layer 106 is formed over the etch stop layer 105. One or more of the contacts 131, 132, 133, 134, 135, the barrier layer 107, and/or isolating dielectric layer 108 can be subsequently formed by metal filling or depositing, which may involve patterning and/or etching operation.

In some embodiments, after fabricating the interconnect structure(s), CET of the ILD 103 in the first region 100A is greater than CET of the ILD 103 in the second region 100B. In some of the embodiments (for example, when ILD 103 includes silicon oxide), a physical thickness of the ILD 103 in the first region 100A is greater than the physical thickness of the ILD 103 in the second region 100B. In some alternative embodiments, the physical thickness of the ILD 103 in the first region 100A is similar to the physical thickness of the ILD 103 in the second region 100B.

Figure 4A:
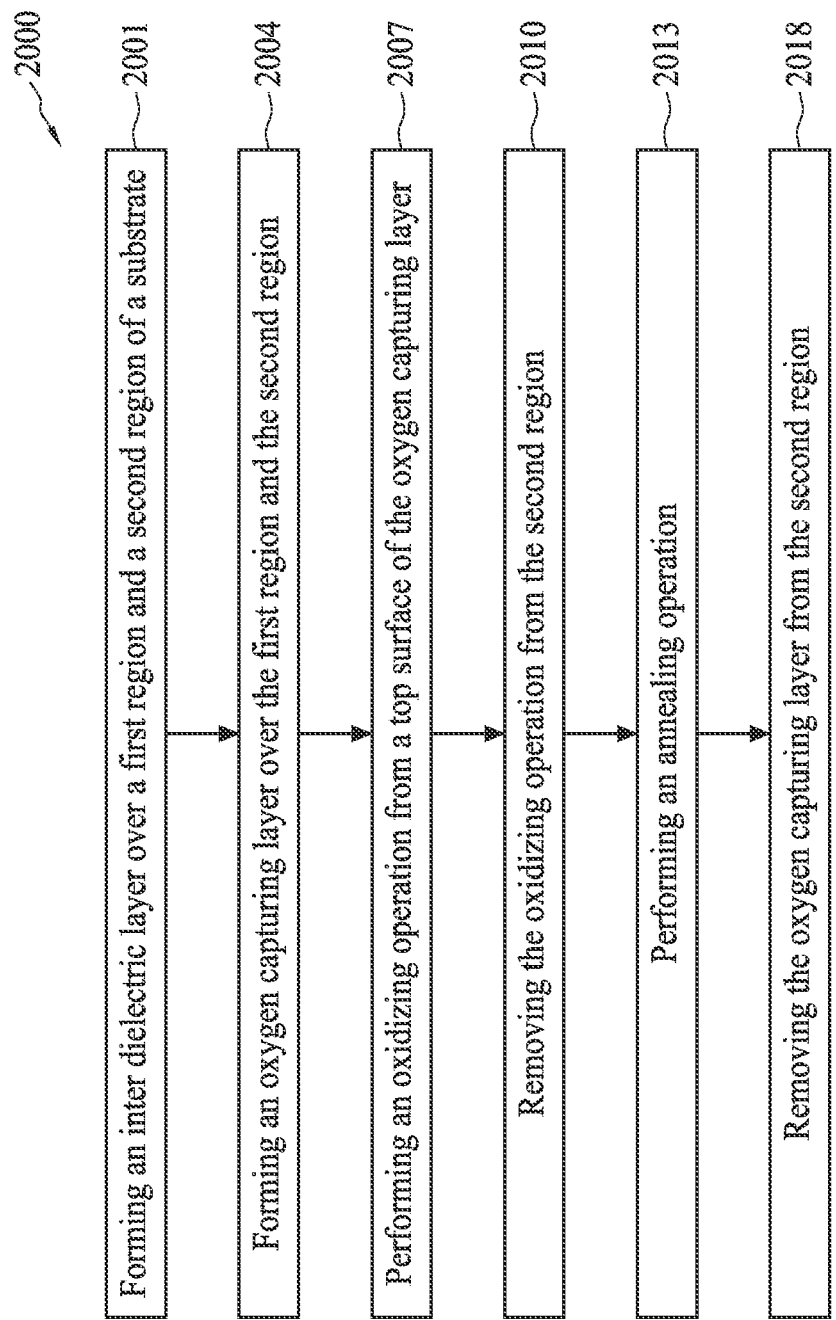
FIG. 4A shows a flow chart representing a method for fabricating a semiconductor device, in accordance with some embodiments of the present disclosure.

Referring to FIG. 4A, FIG. 4A shows a flow chart representing a method for fabricating a semiconductor device, in accordance with some embodiments of the present disclosure. The method 2000 for fabricating a semiconductor device includes forming an inter dielectric layer over a first region and a second region of a substrate (operation 2001, which can be referred to FIG. 3A or operation O201 in FIG. 4B), forming an oxygen capturing layer over the first region and the second region (operation 2004, which can be referred to FIG. 3B or operation O201 in FIG. 4B), performing an oxidizing operation from a top surface of the oxygen capturing layer (operation 2007, which can be referred to FIG. 3B or operation O202 in FIG. 4B), removing the oxidizing operation from the second region (operation 2010, which can be referred to FIG. 3E or operation O204 in FIG. 4B), performing an annealing operation (operation 2013, which can be referred to FIG. 3F or operation O206 in FIG. 4B), and removing the oxygen capturing layer from the first region (operation 2018, which can be referred to FIG. 3G or operation O207 in FIG. 4B).

Figure 4B:
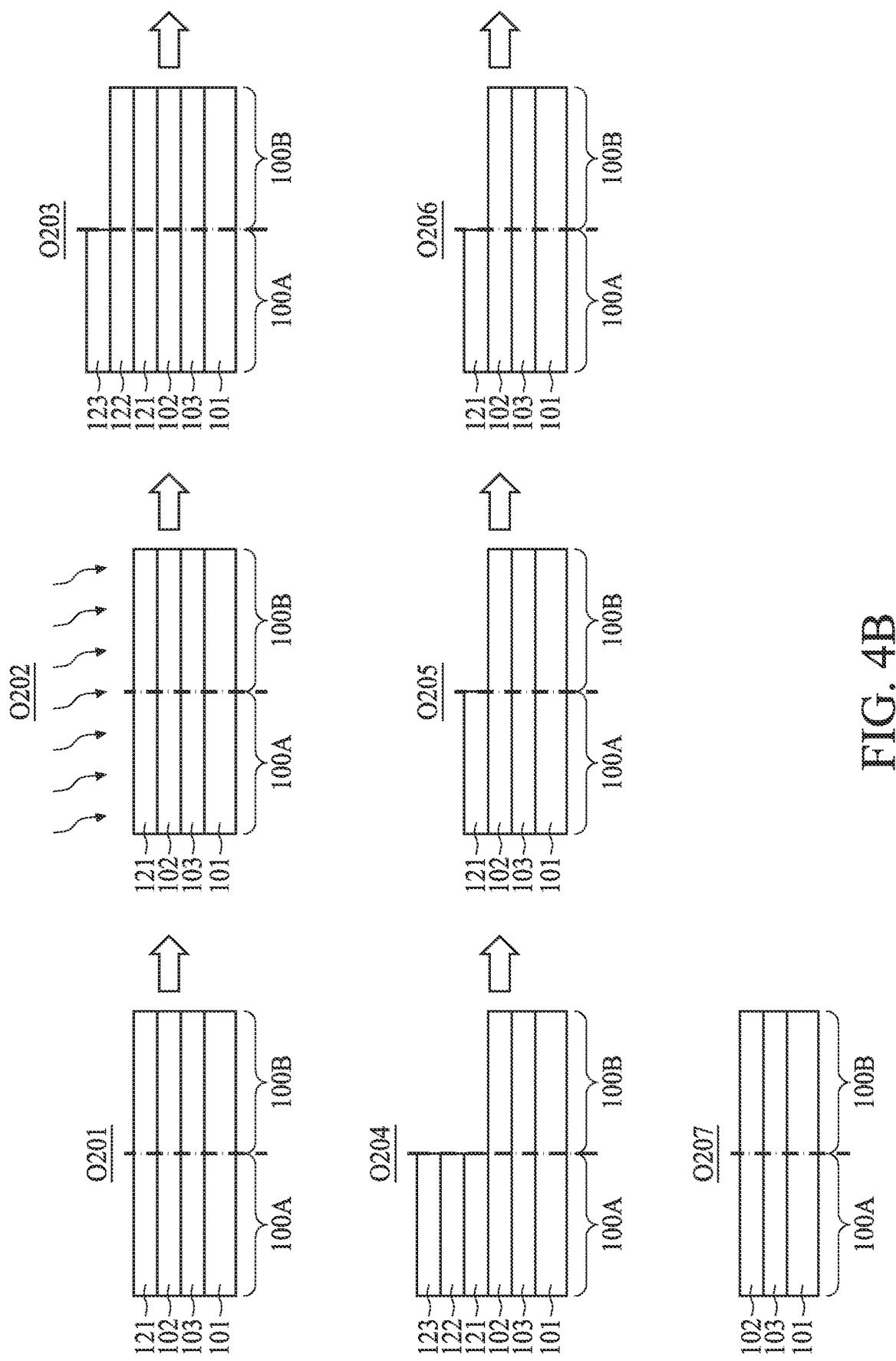
FIG. 4B shows a schematic flow chart representing a method for fabricating a semiconductor device, in accordance with some embodiments of the present disclosure.

Referring to FIG. 4B, FIG. 4B shows a schematic flow chart representing a method for fabricating a semiconductor device, in accordance with some embodiments of the present disclosure. The embodiments discussed in FIG. 4A to FIG. 4B is similar to the embodiments discussed in FIG. 2A to FIG. 3H. The difference resides in the sequence of performing oxidation operation and removing the oxygen capturing layer 121 from the second region 100B.

In operation O201, an ILD 103 is formed over a first region 100A and a second region 100B of the substrate 101, and a high-k material 102M is deposited over the top surface of the ILD 103 over the first region 100A and the second region 100B. The details can be referred to the previous discussion in FIG. 3A. Furthermore, an oxygen capturing layer 121 is formed above the high-k material 102M over the first region 100A and the second region 100B. The details can be referred to the previous discussion in FIG. 3B.

In operation O202, an oxidation operation is performed to increase a concentration of oxygen of the oxygen capturing layer 121 in the first region 100A and the second region 100B. For example, an oxidizing agent is applied over the exposed top surface of the oxygen capturing layer 121 in the first region 100A and the second region 100B, and the oxygen capturing layer 121 captures oxide from the oxidizing agent.

In some embodiments, the oxidizing agent can be liquid agent such as ozonated deionized water ($DIO_3$), other oxygen-containing solution, ozone-containing solution, or other suitable agent. The concentration of $DIO_3$ is in a range from about 6 ppm to about 50 ppm. If the concentration is less than 6 ppm in the solution, the efficiency of oxidation may be lower. The application of the $DIO_3$ can be operated under a temperature from about 20° C. to about 80° C. The duration of applying the $DIO_3$ is in a range from about 30 seconds to about 300 second. In some cases, sulking the oxygen capturing layer 121 in the $DIO_3$ longer than 300 second might not effectively further increase the oxygen concentration. In some cases, sulking the oxygen capturing layer 121 in the $DIO_3$ less than 30 second might not adequately increase the oxygen concentration thereof.

After applying the oxidizing agent, such as $DIO_3$, a rinsing medium may be applied over the oxygen capturing layer 121 to remove the remaining oxidizing agent. For example, the rinsing medium may be pure deionized water, deionized water with $CO_2$, deionized water, or the like. After performing the rinsing operation, a drying operation, such as $N_2$ drying, isopropyl alcohol (IPA) drying, can be performed. In some embodiments, the aforementioned oxidation operation, rinsing and drying may be performed within a single wet tool to facilitate the process. In some alternative embodiments, the oxidation operation can also be conducted by utilizing scanning probe microscope (SPM) oxidation or $O_2$ plasma ash, such as under the condition of damage to the second region 100B can be alleviated, prevented or recovered by further approach. In some embodiments, since the oxygen capturing layer 121 covers the first region 100A and the second region 100B during the oxidation operation, the damage from more aggressive approach to the second region 100B can be alleviated. Some of the details of the oxidation operation, rinsing operation and drying operation can be referred to previous discussion in FIG. 3F.

In operation O203, a mask layer 122 is formed above the oxygen capturing layer 121 over the first region 100A and the second region 100B. A material of the mask layer 122 can be AlO, AlON, TiAl, TiAlO, TaAl, TaAlO, ZrO, LaO, or other suitable material. In some embodiments, the materials of the mask layer 122 are suitable to be utilized as a mask under a photolithography operation. A bottom anti-reflective-coating (BARC) 123 is formed to cover a top surface of the mask layer 122 in the first region 100A. The formation of the BARC 123 includes forming a photoresist layer to define regions to be removal, and by using photolithography patterning and etching techniques, the BARC over the second region 100B is removed. The details of operation O203 can be referred to previous discussion in FIG. 3C and FIG. 3D.

In operation O204, the oxygen capturing layer 121 and the mask layer 122 in the second region 100B not covered by the BARC 123 is removed. In some embodiments, the removal operation includes ashing operation, or other suitable methods. The oxygen capturing layer 121 and the mask layer 122 in the first region 100A are remained. In some embodiments, the high-k material 102M in the second region 100B may be exposed after the removal operation. The details of operation O204 can be referred to previous discussion in FIG. 3E.

In operation O205, the mask layer 122 in the first region 100A and the BARC 123 are removed. The details of operation O205 can be referred to previous discussion in FIG. 3F.

In operation O206, a thermal operation is performed to conduct thermal drive-in operation. Specifically, a portion of oxygen is released from oxygen capturing layer 121 under elevated temperature (for example, in a range from about 600° C. to about 900° C.) and drove into the underlying ILD 103 over the first region 100A. A duration of the thermal operation may be in a range from about 60 seconds to about 300 seconds. In some embodiments, nitrogen may be supplied during the thermal operation. The details of operation O206 can be referred to previous discussion in FIG. 3F.

The capacitance equivalent thickness (CET) of the ILD 103 in the first region 100A can be increased. In some embodiments, the CET of the ILD 103 in the first region 100A is greater than the CET of the ILD 103 in the second region 100B. In some cases, the physical thickness of the ILD 103 in the first region 100A is also increased after performing the oxidation and thermal drive-in operation. For example, a thickness of the ILD 103 in the second region 100B and an original thickness of the ILD 103 in the first region 100A is in a range from about 10.5 Angstrom to about 11.5 Angstrom, and after the oxidation and thermal drive-in operation, the ILD 103 in the first region 100A becomes thicker than the ILD 103 in the second region 100B. In some embodiments, the thickness of the ILD 103 in the first region 100A is increased by a range from about 0.5 Angstrom to about 2.0 Angstrom, or alternatively, increased to be in a range from about 12.5 Angstrom to about 15.0 Angstrom.

In the embodiments of ILD 103 includes silicon oxide ($SiO_x$) and the substrate 101 includes silicon or silicon-based material, a portion of the top surface of the substrate 101 in the first region 100A may also be oxidized and forms silicon oxide ($SiO_x$). In some of such cases, a portion of a boundary between the ILD 103 and the substrate 101 in the first region 100A may be below a top surface of the substrate 101 in the second region 100B.

In operation O207, the oxygen capturing layer 121 in the first region 100A is removed. In some embodiments, the removal operation includes stripping. The details of operation O207 can be referred to previous discussion in FIG. 3G. Operations for forming semiconductor structures as discussed in FIG. 1A to FIG. 1D can be performed after operation O207, and the details can be referred to the discussions in FIG. 1A to FIG. 1D and FIG. 3H.

Figure 5A:
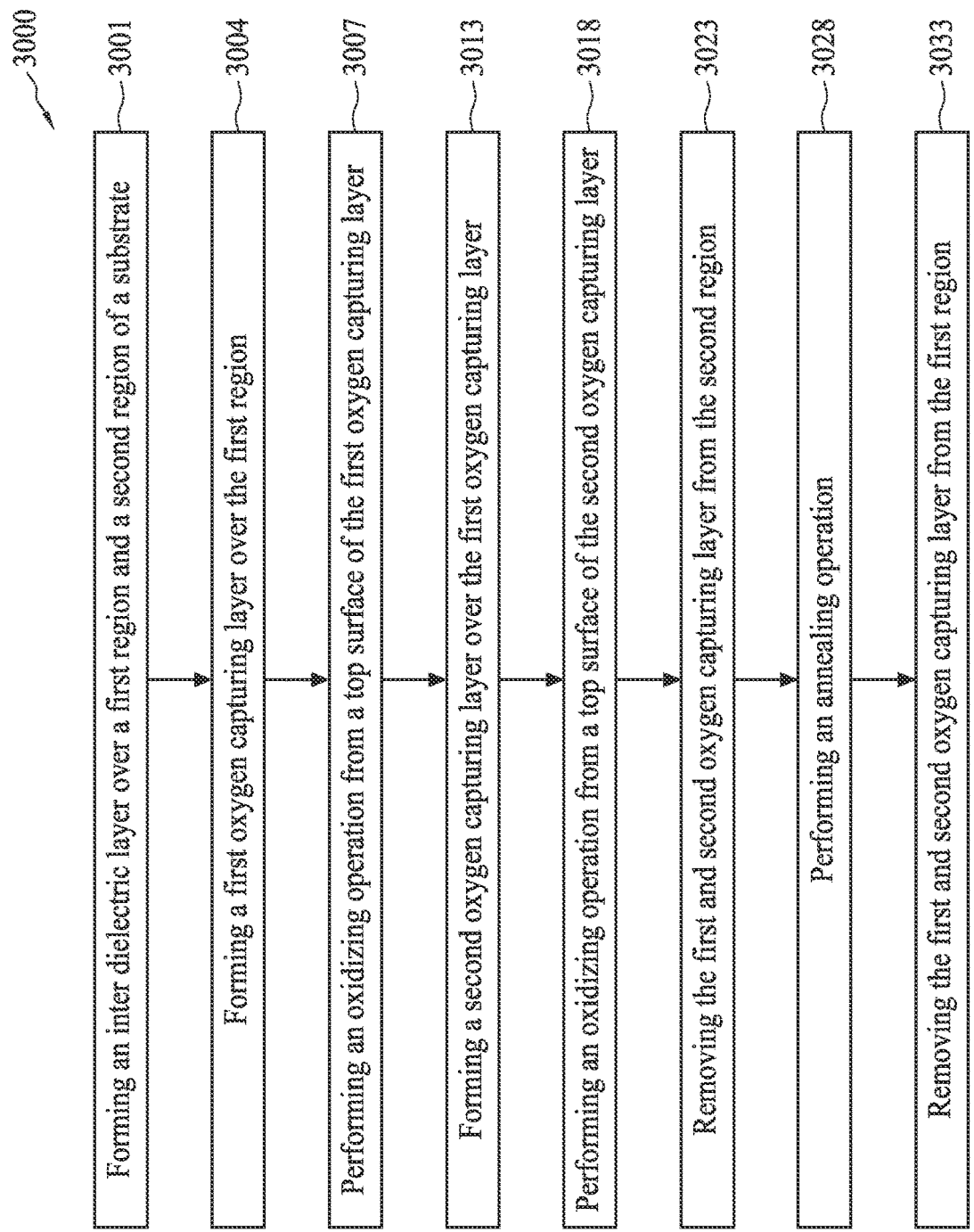
FIG. 5A shows a flow chart representing a method for fabricating a semiconductor device, in accordance with some embodiments of the present disclosure.

Referring to FIG. 5A, FIG. 5A shows a flow chart representing a method for fabricating a semiconductor device, in accordance with some embodiments of the present disclosure. The method 3000 for fabricating a semiconductor device includes forming an inter dielectric layer over a first region and a second region of a substrate (operation 3001, which can be referred to FIG. 6A or operation O301 in FIG. 5B), forming a first oxygen capturing layer over the first region and the second region (operation 3004, which can be referred to FIG. 6B or operation O301 in FIG. 5B), performing an oxidizing operation from a top surface of the first oxygen capturing layer (operation 3007, which can be referred to FIG. 6B or operation O302 in FIG. 5B), forming a second oxygen capturing layer over the first oxygen capturing layer (operation 3013, which can be referred to FIG. 6C or operation O303 in FIG. 5B), performing an oxidizing operation from a top surface of the second oxygen capturing layer (operation 3018, which can be referred to FIG. 6C or operation O303 in FIG. 5B), removing the first and second oxygen capturing layer from the second region (operation 3028, which can be referred to FIG. 6F or operation O305 in FIG. 5B), performing an annealing operation (operation 3023, which can be referred to FIG. 6G or operation O307 in FIG. 5B), and removing the first and second oxygen capturing layer from the first region (operation 3028, which can be referred to FIG. 6H or operation O308 in FIG. 5B).

Figure 5B:
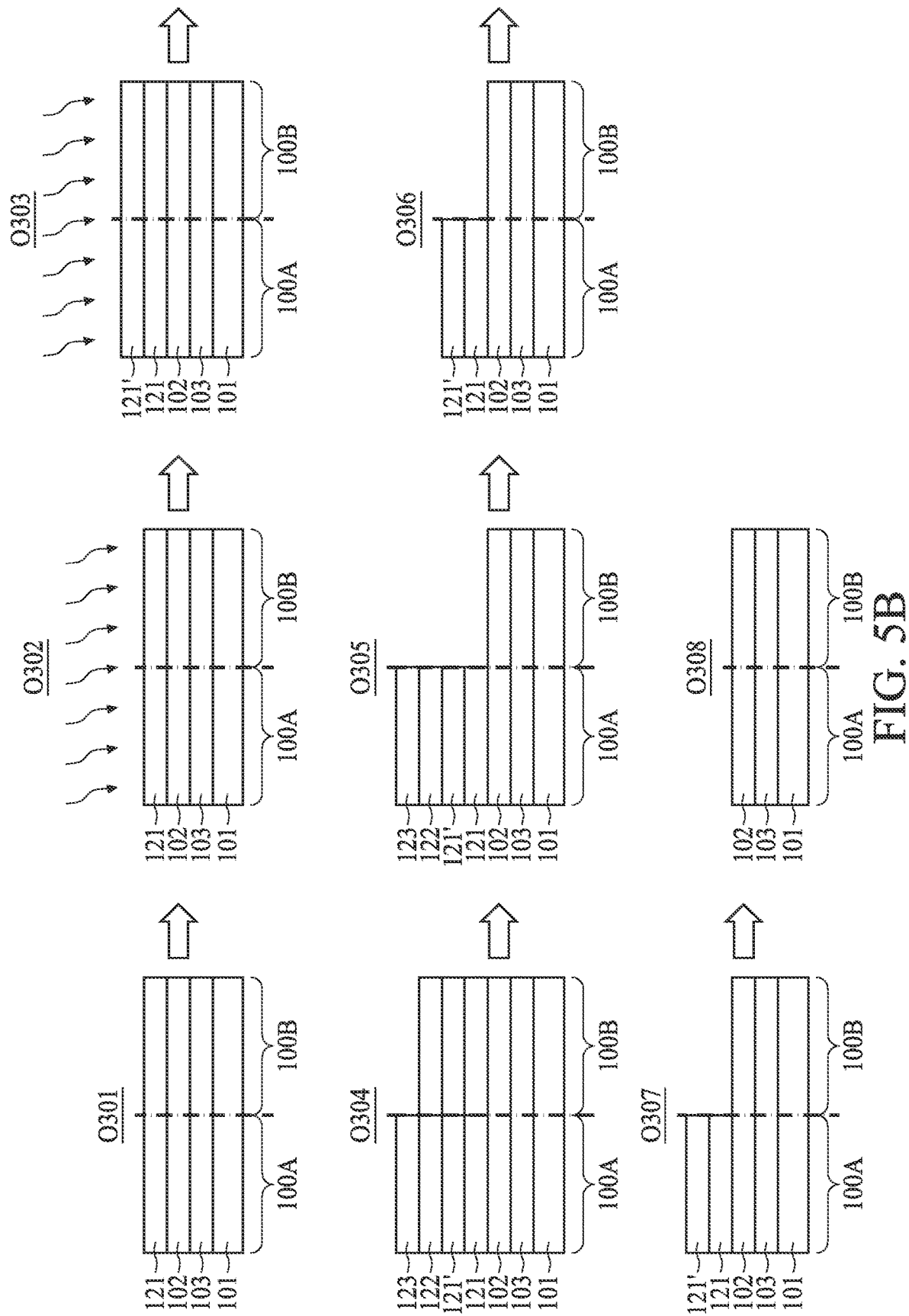
FIG. 5B shows a schematic flow chart representing a method for fabricating a semiconductor device, in accordance with some embodiments of the present disclosure.

Referring to FIG. 5B, FIG. 5B shows a schematic flow chart representing a method for fabricating a semiconductor device, in accordance with some embodiments of the present disclosure. The embodiments discussed in FIG. 5A to FIG. 6I is similar to the embodiments discussed in FIG. 2A to FIG. 3H. The difference resides in that more than one oxygen capturing layers are formed, and oxidation operations are performed over each layer of the oxygen capturing layer.

In some cases, when an oxygen capturing layer is too thick (for example, thicker than 30 Angstrom), a portion of the oxygen capturing layer distal from the top surface may not effectively capture oxygen due to the depth limitation in oxidation operation. Therefore, by alternately performing the formation of an oxygen capturing layer and followed by an oxidation operation, the total oxygen that can be captured by the entire stack of oxygen capturing layers can be improved, and accordingly, the effect of increasing CET of underlying ILD layer can be further enhanced since more oxygen can be drive into ILD layer in thermal drive-in operation.

Figure 6A:
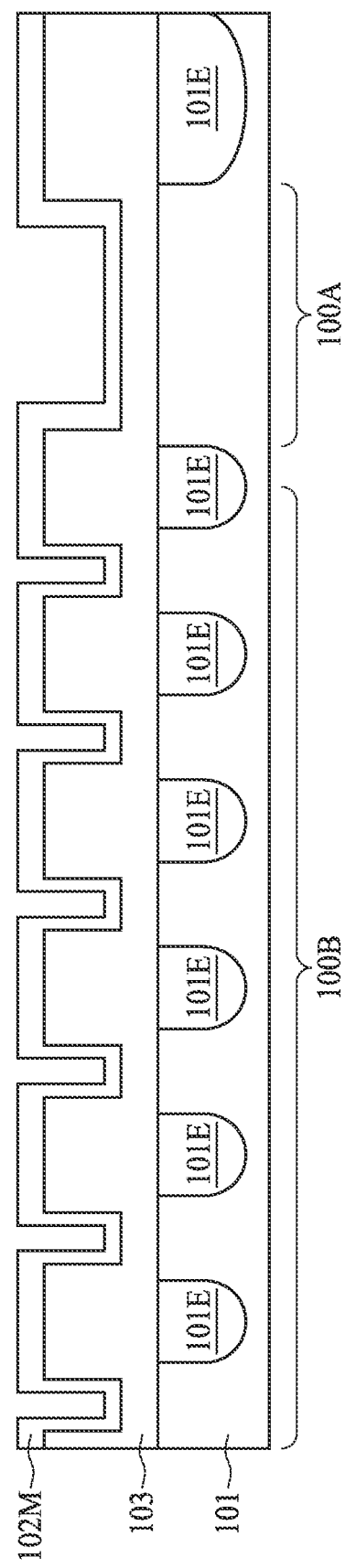
FIG. 6A to FIG. 6I are cross sectional views of a semiconductor device during intermediate stages of manufacturing operations, according to some embodiments of the present disclosure.

Referring to FIG. 6A, FIG. 6A is a cross sectional view of a semiconductor device during intermediate stages of manufacturing operations, according to some embodiments of the present disclosure. Referring to operation O301 (shown in FIG. 5B), an ILD 103 is formed over a first region 100A and a second region 100B of the substrate 101, and a high-k material 102M is deposited over the top surface of the ILD 103 over the first region 100A and the second region 100B. The details can be referred to the previous discussion in FIG. 3A.

Figure 6B:
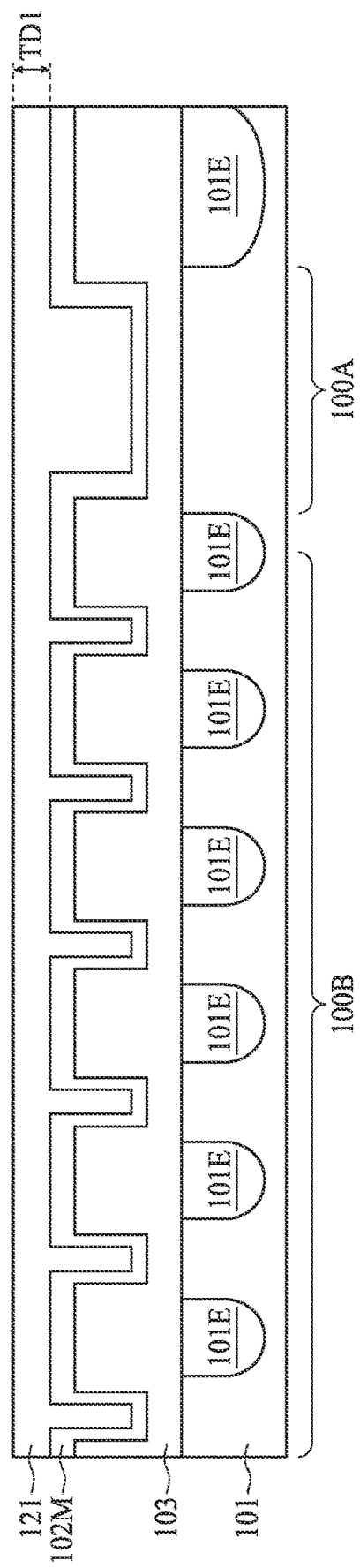

Referring to FIG. 6B, FIG. 6B is a cross sectional view of a semiconductor device during intermediate stages of manufacturing operations, according to some embodiments of the present disclosure. Referring to operation O301 (shown in FIG. 5B), a first oxygen capturing layer 121 is formed above the high-k material 102M over the first region 100A and the second region 100B. The details can be referred to the previous discussion in FIG. 3B.

Referring to operation O302 (shown in FIG. 5B), an oxidation operation is performed to increase a concentration of oxygen of the first oxygen capturing layer 121 in the first region 100A and the second region 100B. For example, an oxidizing agent is applied over the exposed top surface of the first oxygen capturing layer 121 in the first region 100A and the second region 100B, and the first oxygen capturing layer 121 captures oxide from the oxidizing agent. In some embodiments, the oxidizing agent can be liquid agent such as ozonated deionized water ($DIO_3$), other oxygen-containing solution, ozone-containing solution, or other suitable agent. The concentration of $DIO_3$ is in a range from about 6 ppm to about 50 ppm. If the concentration is less than 6 ppm in the solution, the efficiency of oxidation may be lower. The application of the $DIO_3$ can be operated under a temperature from about 20° C. to about 80° C. The duration of applying the $DIO_3$ is in a range from about 30 seconds to about 300 second. In some cases, sulking the first oxygen capturing layer 121 in the $DIO_3$ longer than 300 second might not effectively further increase the oxygen concentration. In some cases, sulking the oxygen capturing layer 121 in the $DIO_3$ less than 30 second might not adequately increase the oxygen concentration thereof. The oxidation operation can be followed by rinsing and drying operations as discussed in FIG. 3F or FIG. 4B (operation 202).

A thickness TD1 of the first oxygen capturing layer 121 is in a range from about 5 Angstrom to about 30 Angstrom. If the thickness TD1 is thicker than the aforementioned range, a portion of the first oxygen capturing layer 121 proximal to the ILD 103 may be less effective with regard to absorbing oxygen, which would decrease the effect or efficiency of subsequent thermal drive-in operation. Some of the details of the oxidation operation can be referred to previous discussion in FIG. 3F or operation O302 in FIG. 4B.

In some alternative embodiments, the oxidation operation can also be conducted by utilizing scanning probe microscope (SPM) oxidation or $O_2$ plasma ash, such as under the condition of damage to the second region 100B can be alleviated, prevented or recovered by further approach.

Figure 6C:
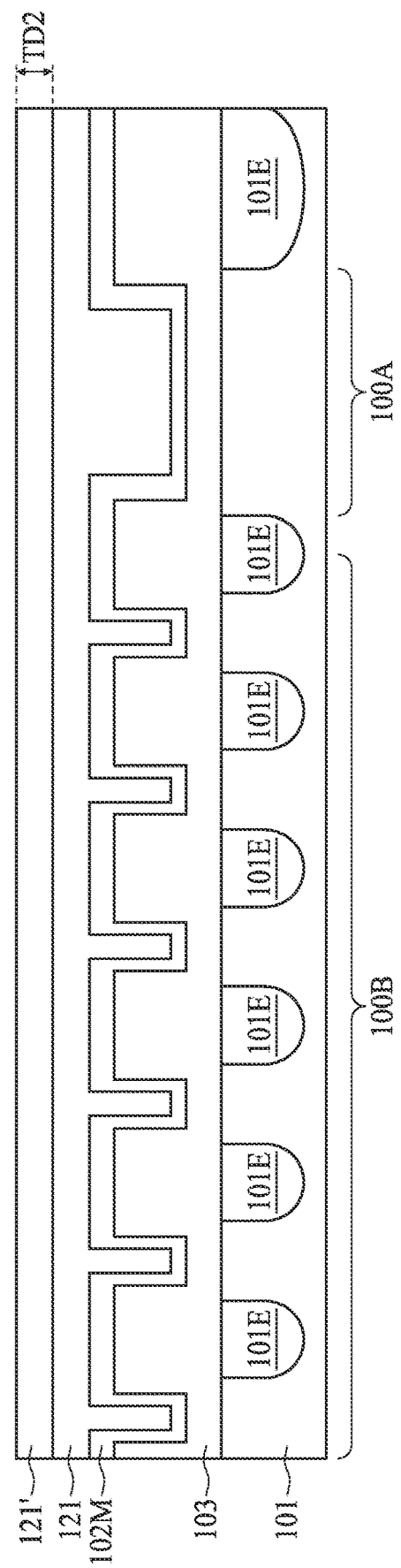

Referring to FIG. 6C, FIG. 6C is a cross sectional view of a semiconductor device during intermediate stages of manufacturing operations, according to some embodiments of the present disclosure. Referring to operation O303 (shown in FIG. 5B), a second oxygen capturing layer 121' is formed above the first oxygen capturing layer 121 over the first region 100A and the second region 100B. In some embodiments, the thickness TD2 of the second oxygen capturing layer 121' can be similar to the thickness TD1 of the first oxygen capturing layer 121. A material of the second oxygen capturing layer 121' may be similar or identical to the first oxygen capturing layer 121. An oxidation operation as discussed in FIG. 3F, operation O202 in FIG. 4B, or FIG. 6B can be performed over the top surface of the second oxygen capturing layer 121'. In some other embodiments, more than two oxygen capturing layers can be formed and more than multiple oxidation operation can be performed.

Figure 6D:
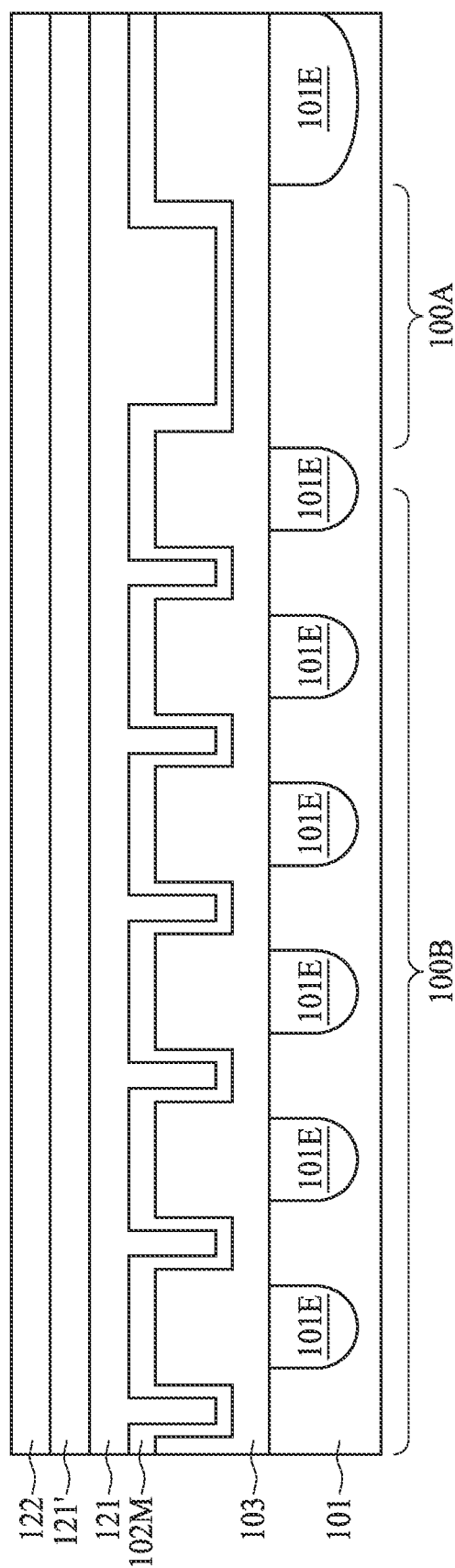

Referring to FIG. 6D, FIG. 6D is a cross sectional view of a semiconductor device during intermediate stages of manufacturing operations, according to some embodiments of the present disclosure. Referring to operation O304 (shown in FIG. 5B), a mask layer 122 is formed above the second oxygen capturing layer 121' over the first region 100A and the second region 100B. A material of the mask layer 122 can be AlO, AlON, TiAl, TiAlO, TaAl, TaAlO, ZrO, LaO, or other suitable material. In some embodiments, the materials of the mask layer 122 are suitable to be utilized as a mask under a photolithography operation. The details of operation O304 can be referred to previous discussion in FIG. 3C.

Figure 6E:
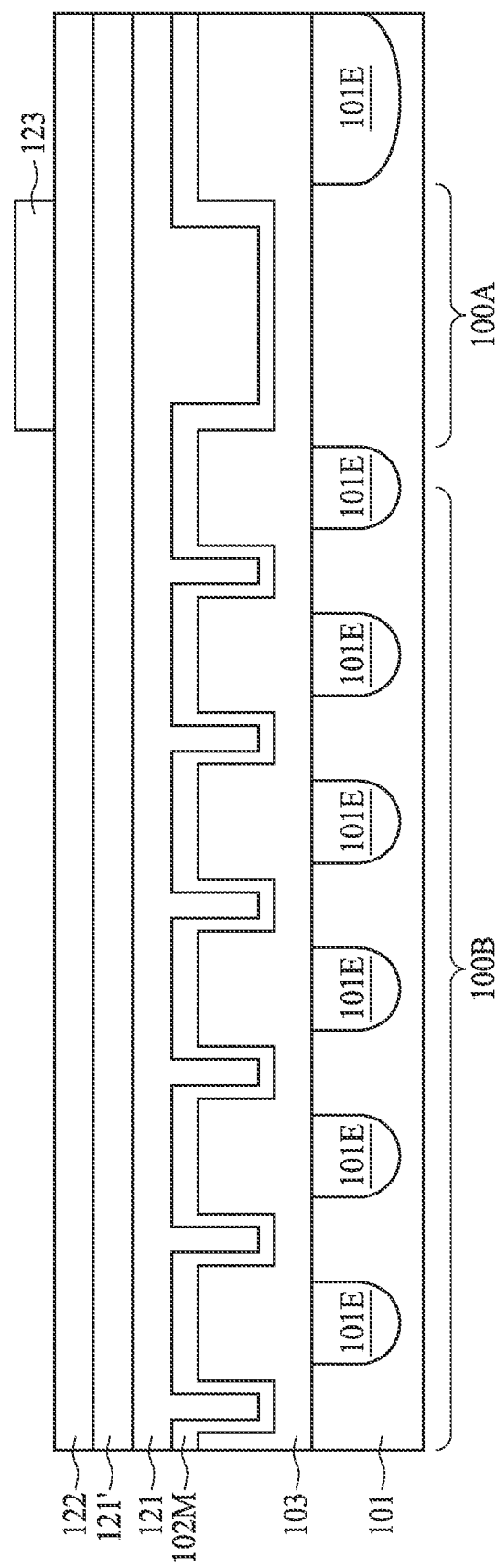

Referring to FIG. 6E, FIG. 6E is a cross sectional view of a semiconductor device during intermediate stages of manufacturing operations, according to some embodiments of the present disclosure. Still referring to operation O304 (shown in FIG. 5B), a bottom anti-reflective-coating (BARC) 123 is formed to cover a top surface of the mask layer 122 in the first region 100A. The formation of the BARC 123 includes forming a photoresist layer to define regions to be removal, and by using photolithography patterning and etching techniques, the BARC over the second region 100B is removed. The details of operation O304 can be referred to previous discussion in FIG. 3D.

Referring to operation O305 (shown in FIG. 5B), the first oxygen capturing layer 121, the second oxygen capturing layer 121' and the mask layer 122 in the second region 100B not covered by the BARC 123 are removed. In some embodiments, the removal operation includes ashing operation, or other suitable methods. The first oxygen capturing layer 121, the second oxygen capturing layer 121' and the mask layer 122 in the first region 100A is remained. In some embodiments, the high-k material 102M in the second region 100B may be exposed after the removal operation. The details of operation O305 can be referred to previous discussion in FIG. 3E.

Figure 6F:
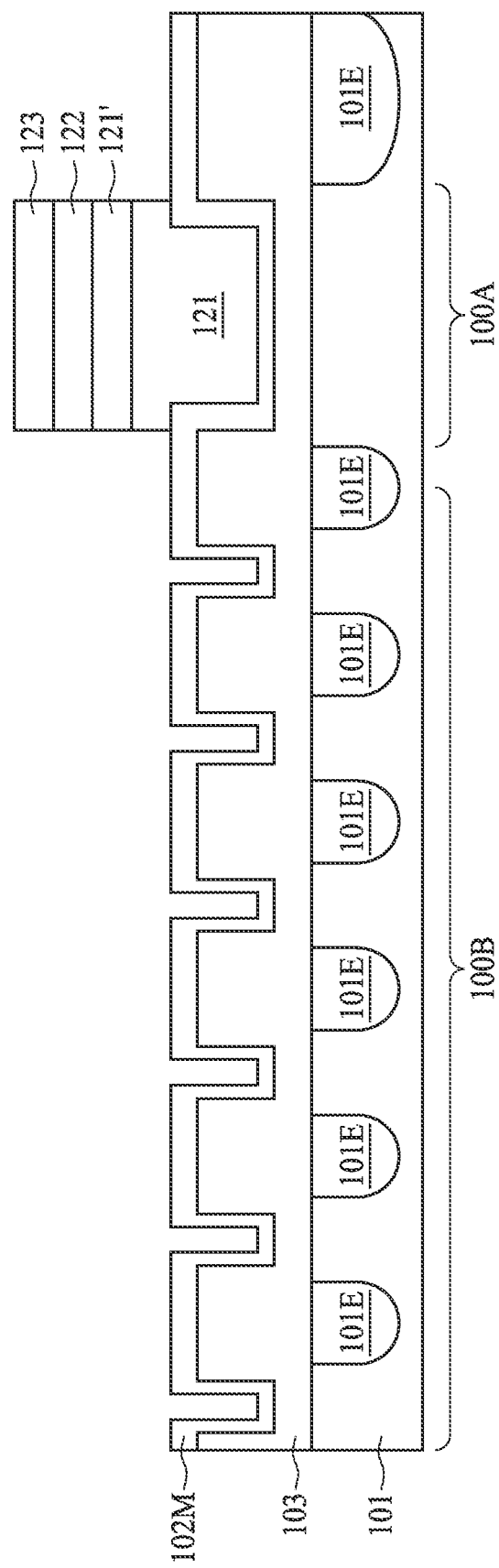

Referring to FIG. 6F, FIG. 6F is a cross sectional view of a semiconductor device during intermediate stages of manufacturing operations, according to some embodiments of the present disclosure. Referring to operation O306 (shown in FIG. 5B), the mask layer 122 in the first region 100A and the BARC 123 are removed. The details of operation O306 can be referred to previous discussion in FIG. 3F.

Figure 6G:
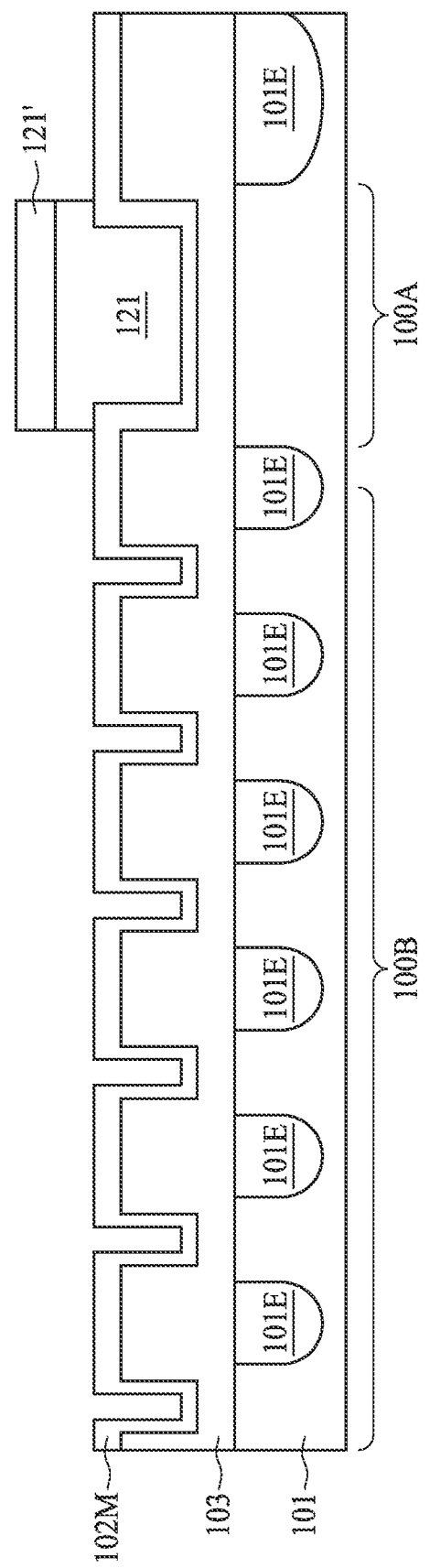

Referring to FIG. 6G, FIG. 6G is a cross sectional view of a semiconductor device during intermediate stages of manufacturing operations, according to some embodiments of the present disclosure. Referring to operation O307 (shown in FIG. 5B), a thermal operation is performed to conduct thermal drive-in operation. Specifically, a portion of oxygen is released from the first oxygen capturing layer 121 and the second oxygen capturing layer 121' under elevated temperature (for example, in a range from about 600° C. to about 900° C.) and drove into the underlying ILD 103 over the first region 100A. A duration of the thermal operation may be in a range from about 60 seconds to about 300 seconds. In some embodiments, nitrogen may be supplied during the thermal operation. The details of operation O307 can be referred to previous discussion in FIG. 3F.

The capacitance equivalent thickness (CET) of the ILD 103 in the first region 100A can be increased. In some embodiments, the CET of the ILD 103 in the first region 100A is greater than the CET of the ILD 103 in the second region 100B. In some cases, the physical thickness of the ILD 103 in the first region 100A is also increased after performing the oxidation and thermal drive-in operation. For example, a thickness of the ILD 103 in the second region 100B and an original thickness of the ILD 103 in the first region 100A is in a range from about 10.5 Angstrom to about 11.5 Angstrom, and after the oxidation and thermal drive-in operation, the ILD 103 in the first region 100A becomes thicker than the ILD 103 in the second region 100B. In some embodiments, the thickness of the ILD 103 in the first region 100A is increased by a range from about 0.5 Angstrom to about 2.0 Angstrom, or alternatively, increased to be in a range from about 12.5 Angstrom to about 15.0 Angstrom. In the embodiments of ILD 103 includes silicon oxide ($SiO_x$) and the substrate 101 includes silicon or silicon-based material, a portion of the top surface of the substrate 101 in the first region 100A may also be oxidized and forms silicon oxide ($SiO_x$). In some of such cases, a portion of a boundary between the ILD 103 and the substrate 101 in the first region 100A may be below a top surface of the substrate 101 in the second region 100B.

Figure 6H:
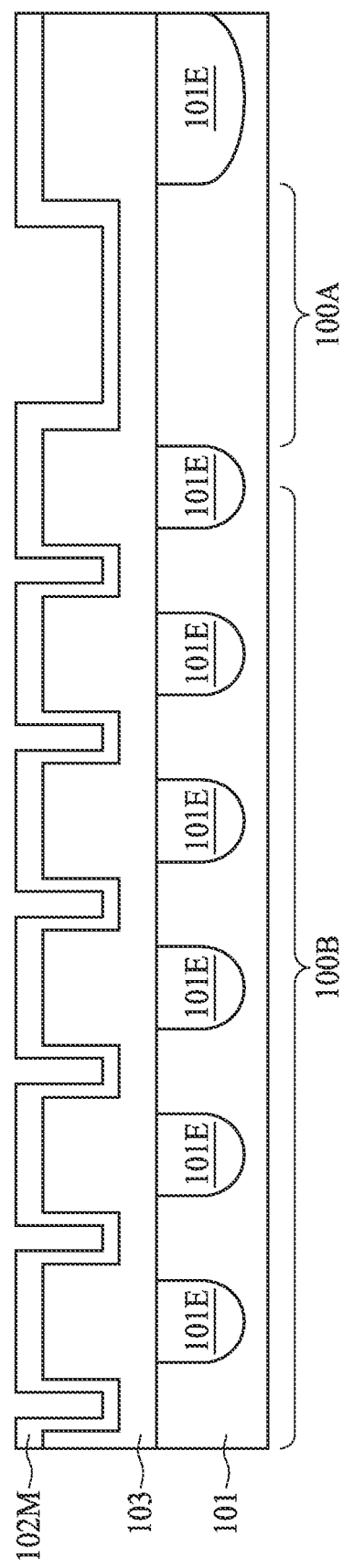

Referring to FIG. 6H, FIG. 6H is a cross sectional view of a semiconductor device during intermediate stages of manufacturing operations, according to some embodiments of the present disclosure. Referring to operation O308 (shown in FIG. 5B), the first oxygen capturing layer 121 and the second oxygen capturing layer 121' in the first region 100A are removed. In some embodiments, the removal operation includes stripping. The details of operation O308 can be referred to previous discussion in FIG. 3G.

Figure 6I:
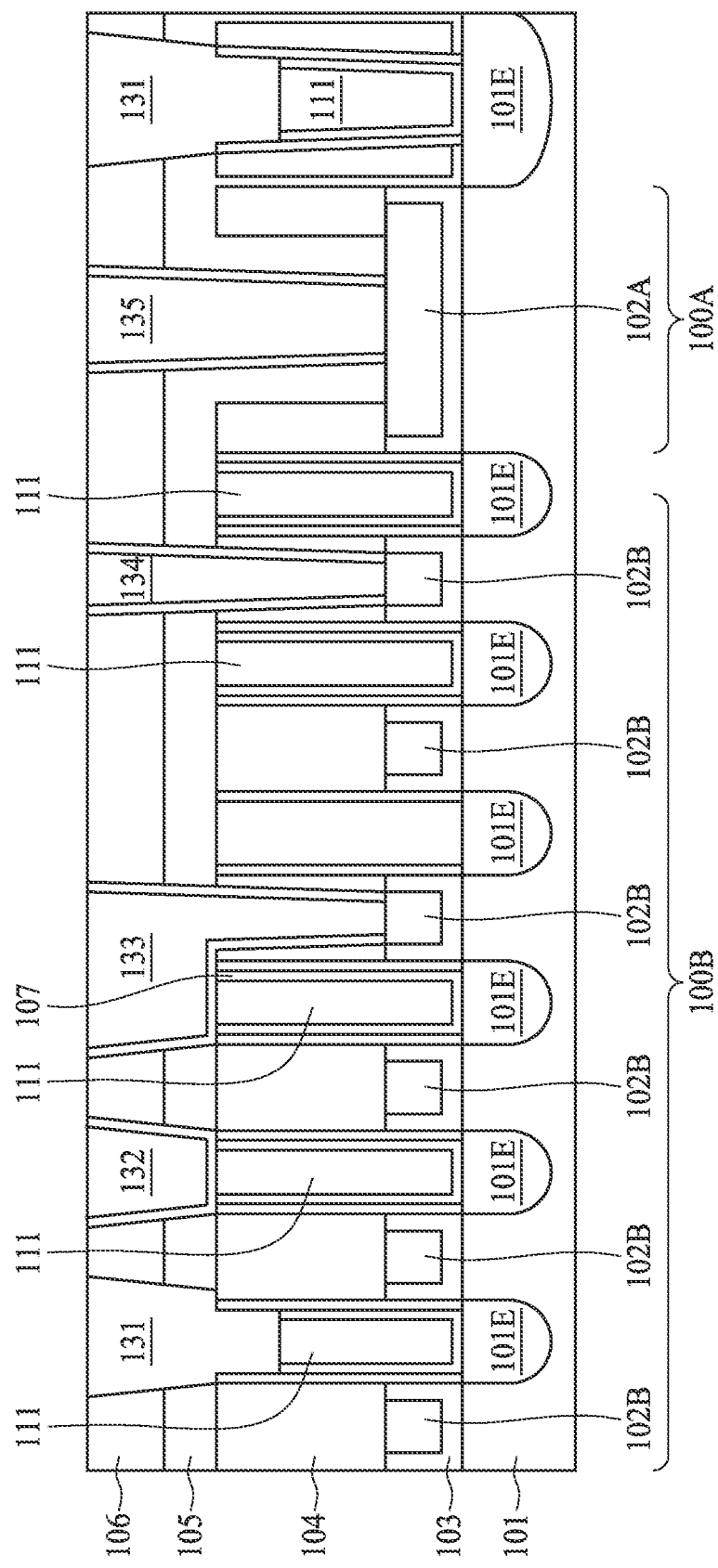

Referring to FIG. 6I, FIG. 6I is a cross sectional view of a semiconductor device during intermediate stages of manufacturing operations, according to some embodiments of the present disclosure. Operations for forming semiconductor structures as discussed in FIG. 1A to FIG. 1D can be performed after operation O308, and the details can be referred to the discussions in FIG. 1A to FIG. 1D and FIG. 3H.

The present disclosure provides a plurality of embodiments to improve the reliability in terms of electrical property of an ILD layer over a certain area of a substrate, especially in advanced technology nodes where the ILD layer may be formed in certain way (such as chemical approach) to comply with design rule but would face the reliability issue in terms of being lack of electrical thickness (e.g. the capacitance equivalent thickness).

In some embodiments, by forming one or more oxygen capturing layer(s) 121 in a defined area, performing an oxidation operation to increase the oxygen concentration in the oxygen capturing layer(s) and followed by a thermal drive-in operation, electrical thickness of the ILD in certain area, or in some cases physical thickness of the ILD, can be improved due to more adequate amount of oxygen available for reaction with ILD. In some embodiments, transition metal-based material, such as TiN, TiSiN, TiAlN, TaN, TaSiN, TaAlN, MoN, MoAlN, WN, WSiN, WCN, nitride-based material, or the like, can be selected as suitable oxygen capturing layer. The thermal drive-in operation helps releasing oxygen from oxygen capturing layer(s) 121 and drive oxygen into underlying ILD 103.

In some cases it may be required to alleviate the influence over an adjacent region (e.g. second region 100B, which may be core region) during the oxidation treatment over the ILD in the first region 100A (which may be an I/O region). In some embodiments, the oxygen capturing layer(s) 121 over the second region is removed prior to performing the thermal drive in operation. In addition, using oxidizing agent, such as ozonated deionized water ($DIO_3$), can facilitate the operation of increasing the amount of oxygen in the oxygen capturing layer(s) 121, and may alleviate the damage over the exposed high-k material in unprotected area (such as second region 100B) during the stage of oxidation operation.

The embodiments discussed in FIG. 2A to FIG. 3H provides an "oxidation treatment-last" approach. Specifically, the oxidation operation is performed after the oxygen capturing layer(s) 121 over the first region 100A is defined and the oxygen capturing layer(s) 121 over the second region 100B is removed. The advantage of this approach may resides in that (but not limited to) the duration between the timing of performing the oxidation operation and the timing of thermal drive-in operation is decreased, thus the plausible time-dependent loss of oxygen from the oxygen capturing layer(s) 121 can be alleviated.

The embodiments discussed in FIG. 4A to FIG. 4B provides an "oxidation treatment-first" approach. Specifically, the oxidation operation is performed prior to removing the oxygen capturing layer(s) 121 over the second region 100B. The advantage of this approach may resides in that (but not limited to) the oxidation operation is performed directly over the top surface of the oxygen capturing layer(s) 121 over the first region 100A and the second region 100B, thus alleviate the influence over the high-k material 102M in second region 100B. Some of the more aggressive oxidation approaches can be utilized.

The embodiments discussed in FIG. 5A to FIG. 6I provides a "capping-oxidation-capping-oxidation (COCO)" approach. In some cases, when an oxygen capturing layer is too thick, a portion of the oxygen capturing layer distal from the top surface (i.e. bottom portion) may not effectively capture oxygen due to the depth limitation in oxidation operation. For example, the thermal drive-in operation may only drive-in to a depth of 30 Angstrom in designated temperature range (such as in a range from about 600° C. to about 900° C.). Therefore, by alternately performing the formation of an oxygen capturing layer and followed by an oxidation operation, the total amount of oxygen that can be captured by the entire stack of oxygen capturing layers can be improved.

The present disclosure can be applied to advanced technology nodes, for example, can be utilized in forming FinFET, Complementary Metal-Oxide-Semiconductor (CMOS), Metal-Oxide-Semiconductor Field Effect Transistor (MOSFET), nanowire structure, nanosheet structure, gate-all-around (GAA) structure, or the like.

Some embodiments of the present disclosure provide a method for fabricating a semiconductor structure, including forming an inter dielectric layer over a first region and a second region of a substrate, wherein the second region is adjacent to the first region, forming a high-k material over the inter dielectric layer in the first region and the second region, forming an oxygen capturing layer over the high-k material in the first region, and applying oxidizing agent over the oxygen capturing layer.

Some embodiments of the present disclosure provide a method for fabricating a semiconductor structure, including forming an inter dielectric layer over a first region and a second region of a substrate, wherein the second region is adjacent to the first region, and increasing a first thickness of the inter dielectric layer in the first region, including forming an oxygen capturing layer over the first region, and performing an oxidizing operation from a top surface of the oxygen capturing layer to increase oxygen concentration of the oxygen capturing layer.

Some embodiments of the present disclosure provide a method for fabricating a semiconductor structure, including forming an inter dielectric layer over a first region and a second region of a substrate, wherein the second region is adjacent to the first region, forming a first oxygen capturing layer over the first region, increasing a concentration of oxygen in the first oxygen capturing layer by applying oxidizing agent over a top surface of the first oxygen capturing layer, removing the first oxygen capturing layer from the first region, and forming a first gate structure in the first region.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a semiconductor structure, comprising:
    forming a dielectric layer over a first region and a second region of a substrate, wherein the second region is adjacent to the first region, and a profile of the dielectric layer presents a plurality of recesses extending toward the substrate;
    increasing a thickness of the dielectric layer in the first region, comprising:
        forming an oxygen capturing layer over the dielectric layer in the first region, comprising:
            forming the oxygen capturing layer over the first region and the second region, the recess in the first region is covered by the oxygen capturing layer; and
            removing the oxygen capturing layer over the second region with a mask layer;
        performing an oxidizing operation from a top surface of the oxygen capturing layer to increase oxygen concentration of the oxygen capturing layer after removing the oxygen capturing layer over the second region;
        removing the oxygen capturing layer over the first region after performing the oxidizing operation to expose the recess in the first region;
    forming a gate structure over the dielectric layer and within the recess in the first region; and
    performing a planarization operation to align an upper surface of the gate structure and an upper surface of the dielectric layer.

2. The method of claim 1, further comprising forming a high-k material over the dielectric layer in the first region and the second region.

3. The method of claim 2, wherein forming the oxygen capturing layer comprises: forming the oxygen capturing layer over the high-k material in the first region.

4. The method of claim 2, further comprising: removing the oxygen capturing layer over the first region to expose a top surface of the high-k material in the first region.

5. The method of claim 1, wherein the oxidizing operation comprises: applying oxidizing agent over the oxygen capturing layer, wherein a first thickness of the dielectric layer in the first region becomes greater than a second thickness of the dielectric layer in the second region subsequent to applying the oxidizing agent.

6. The method of claim 1, wherein a material of the dielectric layer is different from a material of the oxygen capturing layer.

7. The method of claim 1, wherein after performing the oxidizing operation, the oxygen capturing layer over the first region is removed by stripping.

8. The method of claim 1, wherein the upper surface of the gate structure in the first region is coplanar with an upper surface of a plurality of gate structures in the second region.

9. The method of claim 1, wherein the gate structure is formed through filling a work function metal in the plurality of recesses.

10. A method for fabricating a semiconductor structure, comprising:
    forming a dielectric layer over a first region and a second region of a substrate, wherein the second region is adjacent to the first region, and a profile of the dielectric layer presents a plurality of recesses extending toward the substrate;
    forming a high-k material over the dielectric layer in the first region and the second region;
    patterning a first oxygen capturing layer with a mask to expose a portion of the high-k material in the second region;
    applying oxidizing agent over the first oxygen capturing layer, wherein a first thickness of the dielectric layer in the first region becomes greater than a second thickness of the dielectric layer in the second region subsequent to applying the oxidizing agent;

removing a remaining portion of the first oxygen capturing layer after applying oxidizing agent over the first oxygen capturing layer to expose the recess in the first region; and forming a gate structure in the exposed recess in the first region.

11. The method of claim 10, wherein the oxidizing agent is applied after patterning the first oxygen capturing layer.

12. The method of claim 10, wherein the oxidizing agent is applied prior to patterning the first oxygen capturing layer.

13. The method of claim 10, further comprising: performing an annealing operation on the first oxygen capturing layer under a temperature that is in a range from 600° C. to 900° C.

14. The method of claim 10, further comprising: forming a second oxygen capturing layer over the first oxygen capturing layer after applying the oxidizing agent over the first oxygen capturing layer.

15. The method of claim 10, further comprising:
performing a planarization operation to align an upper surface of the gate structure in the first region and an upper surface of a plurality of gate structures in the second region.

16. The method of claim 10, wherein the oxidizing agent comprises ozonated deionized water ($DIO_3$).

17. The method of claim 16, wherein a concentration of $DIO_3$ is in a range from about 6 ppm to about 50 ppm.

18. A method for fabricating a semiconductor structure, comprising:
forming a first gate structure over a first region of a substrate and forming a second gate structure over a second region adjacent to the first region, comprising;
forming a dielectric layer over the first region and the second region;
forming a high-k material covering the dielectric layer in the first region and the second region;
forming an oxygen capturing layer covering the high-k material in the first region;
increasing a concentration of oxygen in the oxygen capturing layer by applying oxidizing agent over a top surface of the oxygen capturing layer under a first temperature;
performing an annealing operation on the oxygen capturing layer under a second temperature, wherein the first temperature is lower than the second temperature;
removing the oxygen capturing layer from the first region after the annealing operation; and
forming a work function metal layer over the high-k material,
wherein a first thickness of the dielectric layer in the first region becomes greater than a second thickness of the dielectric layer in the second region subsequent to applying the oxidizing agent.

19. The method of claim 18, wherein the second temperature is in a range from 600° C. to 900° C.

20. The method of claim 18, wherein a dimension of the first gate structure is greater than a dimension of the second gate structure.

* * * * *